United States Patent
Salmon

(10) Patent No.: US 10,402,922 B2
(45) Date of Patent: Sep. 3, 2019

(54) PHOTOVOLTAIC SYSTEM INSTALLATION

(71) Applicant: Vivint Solar, Inc., Lehi, UT (US)

(72) Inventor: Ryan Salmon, Lehi, UT (US)

(73) Assignee: Vivint Solar, Inc., Lehi, UT (US)

(*) Notice: Subject to any disclaimer, the term of this patent is extended or adjusted under 35 U.S.C. 154(b) by 829 days.

(21) Appl. No.: 14/682,764

(22) Filed: Apr. 9, 2015

(65) Prior Publication Data

US 2015/0294428 A1    Oct. 15, 2015

Related U.S. Application Data

(60) Provisional application No. 61/977,760, filed on Apr. 10, 2014.

(51) Int. Cl.
| | |
|---|---|
| *G06Q 50/16* | (2012.01) |
| *G01R 21/00* | (2006.01) |
| *H02S 50/00* | (2014.01) |
| *G06Q 10/06* | (2012.01) |

(52) U.S. Cl.
CPC .......... *G06Q 50/165* (2013.01); *G01R 21/00* (2013.01); *G06Q 10/06313* (2013.01); *H02S 50/00* (2013.01)

(58) Field of Classification Search
None
See application file for complete search history.

(56) References Cited

U.S. PATENT DOCUMENTS

| | | | |
|---|---|---|---|
| 9,225,286 B1* | 12/2015 | Tweedie | H02M 1/00 |
| 2010/0071274 A1* | 3/2010 | Brescia | E04B 2/88 |
| | | | 52/27 |
| 2011/0047048 A1* | 2/2011 | Yahiro | G06Q 10/10 |
| | | | 705/26.41 |
| 2011/0068624 A1* | 3/2011 | Dibachi | H02J 7/35 |
| | | | 307/18 |
| 2011/0278411 A1* | 11/2011 | Carbonare | F24S 25/16 |
| | | | 248/237 |
| 2012/0121125 A1* | 5/2012 | Dimov | G01W 1/12 |
| | | | 382/103 |
| 2013/0061142 A1* | 3/2013 | Brier | G06F 3/0481 |
| | | | 715/709 |

\* cited by examiner

*Primary Examiner* — Kurtis Gills
*Assistant Examiner* — Akosua Kyereme-Tuah
(74) *Attorney, Agent, or Firm* — TraskBritt

(57) ABSTRACT

The present invention is directed to a photovoltaic installation process. A process may include determining a method of interconnection to couple a photovoltaic system to an electrical system of a structure. The process may further include determining, via an electronic device, an ideal usage offset ratio for the photovoltaic system based on a known utility rate associated with the structure. Moreover, the process may include estimating a number of modules required to meet the determined ideal usage offset ratio. In addition, the process may include generating, via the electronic device, installation information including required installation materials, estimated costs, point-load, and electrical information for the photovoltaic system.

25 Claims, 43 Drawing Sheets

PHOTOVOLTAIC SYSTEM INSTALLATION

CROSS-REFERENCE TO RELATED APPLICATION

A claim for the benefit of priority to the Apr. 10, 2014 filing date of U.S. Provisional Patent Application No. 61/977,760, titled PHOTOVOLTAIC SYSTEM INSTALLATION ("the '760 Provisional Application"), is hereby made pursuant to 35 U.S.C. § 119(e). The entire disclosure of the '760 Provisional Application is, hereby incorporated herein.

TECHNICAL FIELD

This disclosure relates generally to photovoltaic systems and, more specifically, to installation of photovoltaic systems.

BACKGROUND OF RELATED ART

Solar panels, which may include a set of solar photovoltaic modules, use light energy (photons) from the sun to generate electricity through the photovoltaic effect. A photovoltaic system including a plurality of solar panels and various other electrical components may be used to generate and supply electricity in commercial and residential applications.

The addition of solar panels to new and existing structures is becoming increasingly popular due to growing public awareness about energy independence, the desire to curb rising energy costs, and the increased affordability of solar panels.

BRIEF SUMMARY OF THE INVENTION

In one specific embodiment, a photovoltaic installation process may include determining a method of interconnection to couple a photovoltaic system to an electrical system of a structure. The process may further include determining, via an electronic device, an ideal usage offset ratio for the photovoltaic system based on a known utility rate associated with the structure. Moreover, the process may include estimating a number of modules required to meet the determined ideal usage offset ratio. In addition, the process may include generating, via the electronic device, installation information with a design tool including required installation materials, estimated costs, point-load, and electrical information for the photovoltaic system.

In another specific embodiment, a system includes an electronic device including a processor. The system also includes a computer-readable medium coupled to the processor. Further, the system may include an application program stored in the computer-readable medium. The application program, when executed by the processor, is configured to determine an ideal usage offset ratio for the photovoltaic system based on one or more parameters associated with a structure having a known location. The application program may also be configured to estimate a number of modules required to meet the determined ideal usage offset ratio. In addition, the application program may be configured to generate installation information for the photovoltaic system based at least partially on location-specific information and the estimated number of modules.

Yet other embodiments of the present disclosure comprise computer-readable media storage storing instructions that when executed by a processor cause the processor to perform instructions in accordance with one or more embodiments described herein.

Other aspects, as well as features and advantages of various aspects, of the present invention will become apparent to those of ordinary skill in the art through consideration of the ensuing description, the accompanying drawings and the appended claims.

BRIEF DESCRIPTION OF THE DRAWINGS

FIG. 6 is a screenshot illustrating a design folder and a software design tool;

FIG. 25 is a screenshot illustrating a one-line diagram for a photovoltaic system in a computer-aided design program;

FIG. 38 is yet another screenshot of a management system; and

DETAILED DESCRIPTION

Referring in general to the accompanying drawings, various embodiments of the present invention are illustrated to show the structure and methods for installing a system, such as a photovoltaic system. Common elements of the illustrated embodiments are designated with like numerals. It should be understood that the figures presented are not meant to be illustrative of actual views of any particular portion of the actual device structure, but are merely schematic representations which are employed to more clearly and fully depict embodiments of the invention.

The following provides a more detailed description of the present invention and various representative embodiments thereof. In this description, functions may be shown in block diagram form in order not to obscure the present invention in unnecessary detail. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Figure 1:
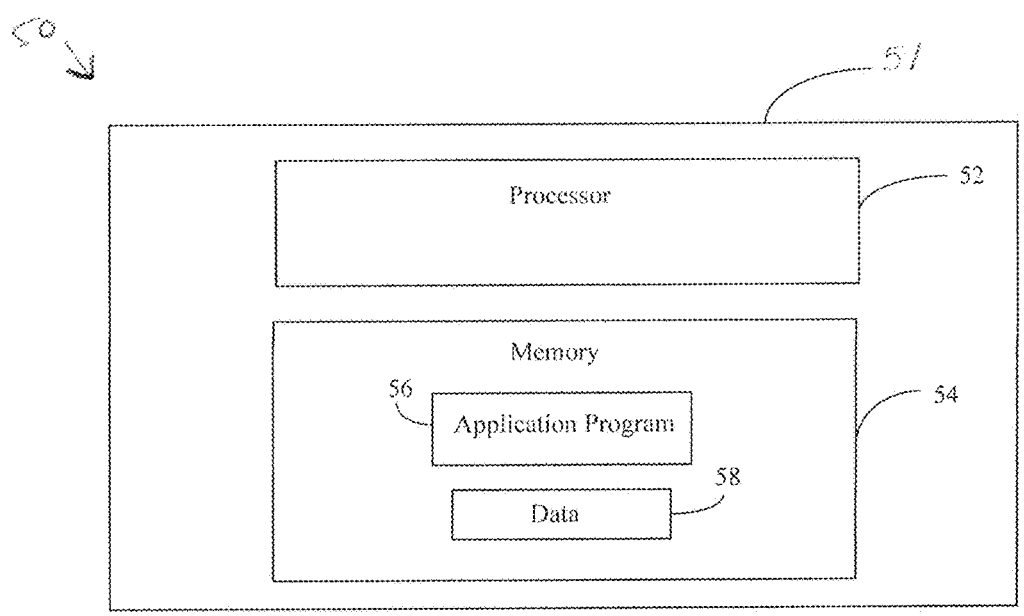
FIG. 1 illustrates a system including an electronic device, according to an embodiment of the present disclosure.

FIG. 1 is a block diagram illustrating an embodiment of system 50 including an electronic device 51 comprising a processor 52 and memory 54. Processor 52 may comprise any known and suitable processor. Memory 54 may include an application program 56 and data 58, which may comprise stored data. Application program 56 may include instructions that, when read and executed by processor 52, may cause processor 52 to perform steps necessary to implement and/or use embodiments of the present disclosure. Application program 56 and/or operating instructions may also be tangibly embodied in memory 54, thereby making a computer program product or article of manufacture according to an embodiment of the present disclosure. As such, the term "application program" as used herein is intended to encompass a computer program accessible from any computer readable device or media. Further, application program 56 may be configured to access and manipulate data 58 stored in memory 54 of electronic device 51. In addition, memory 54 may be configured for storing any data (i.e., information) related to a photovoltaic system and/or a process of installing a photovoltaic system.

Figure 2:
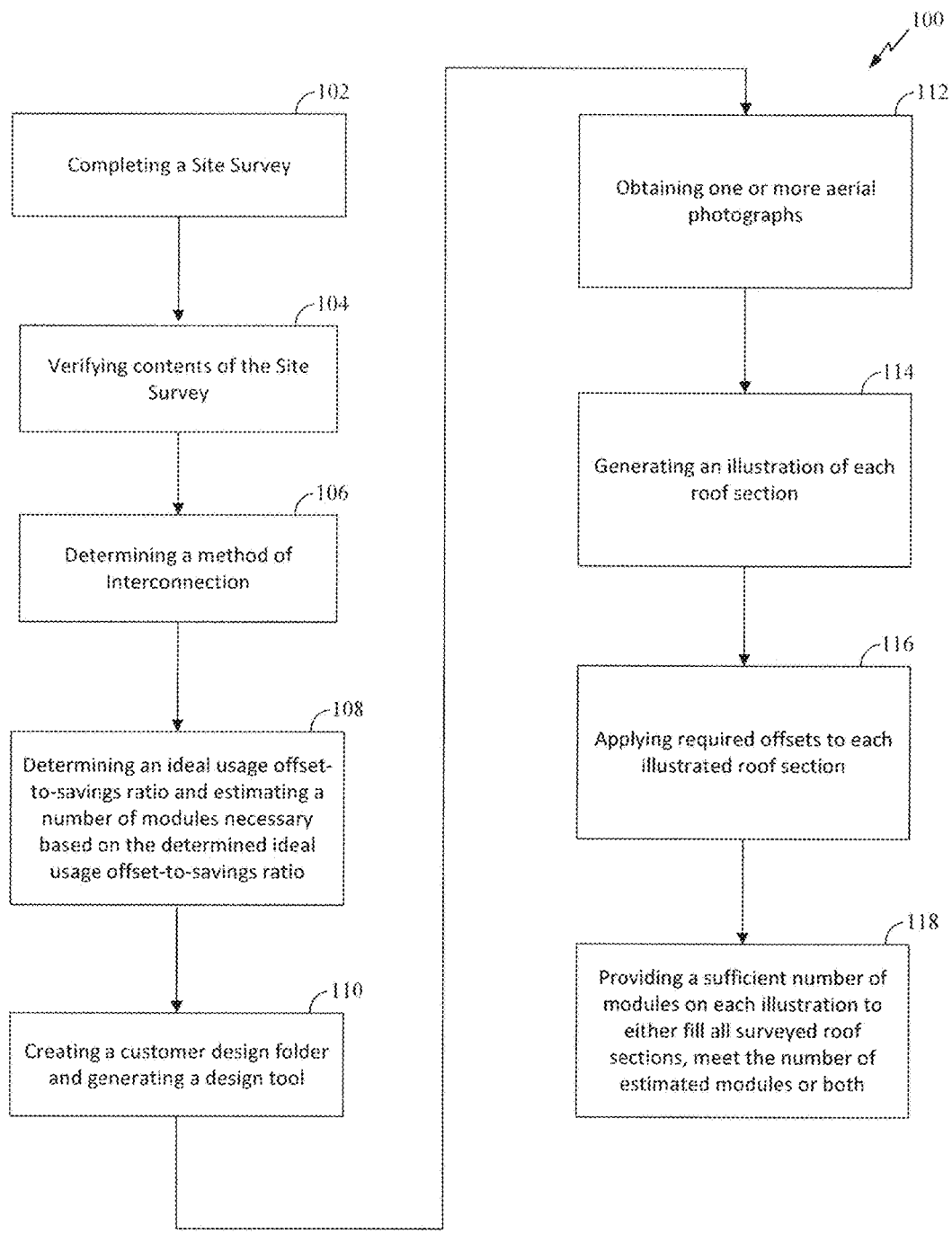
FIG. 2 illustrates a process, in accordance with an embodiment of the present disclosure.
Figure 2:
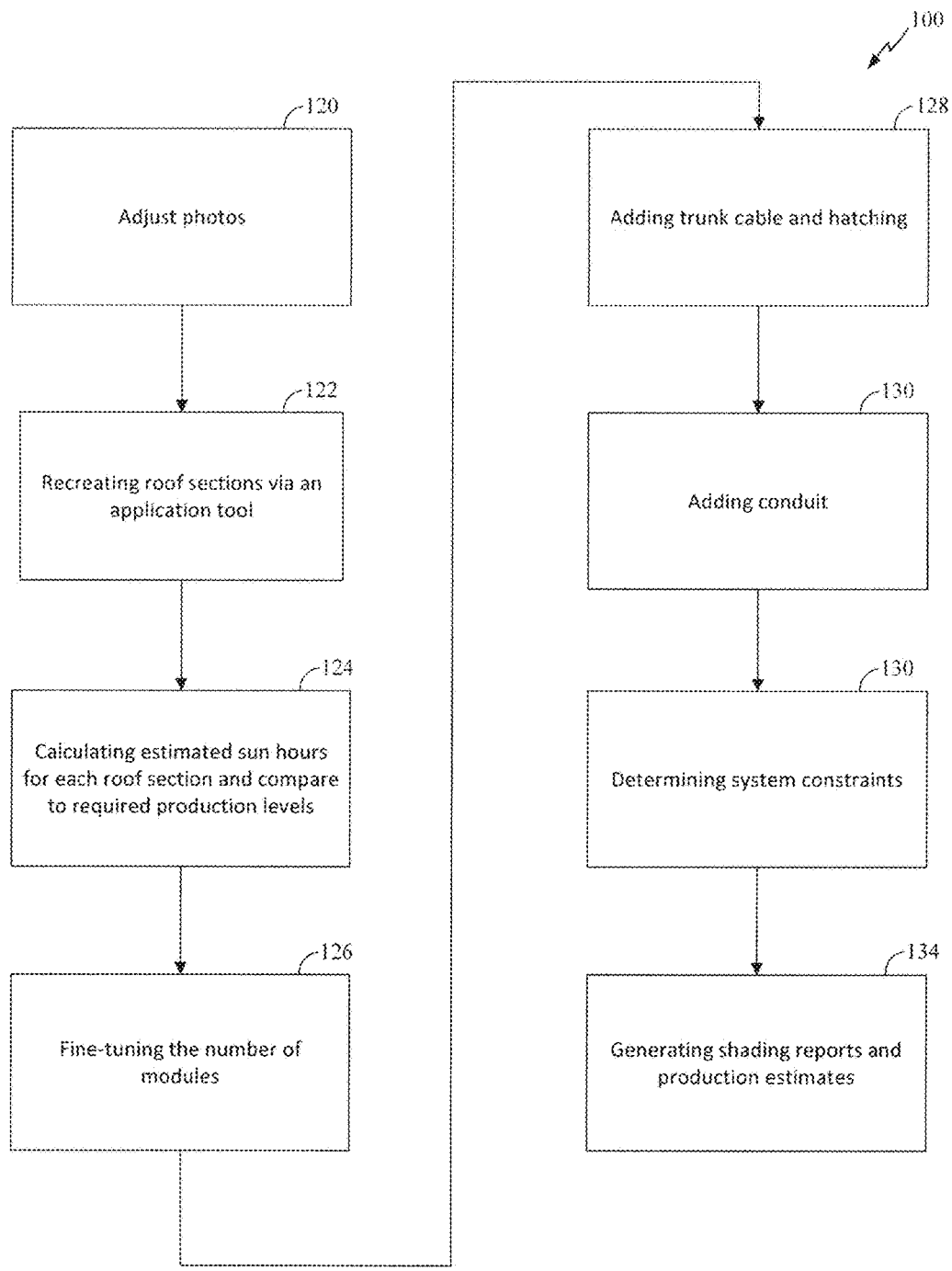
Figure 2:
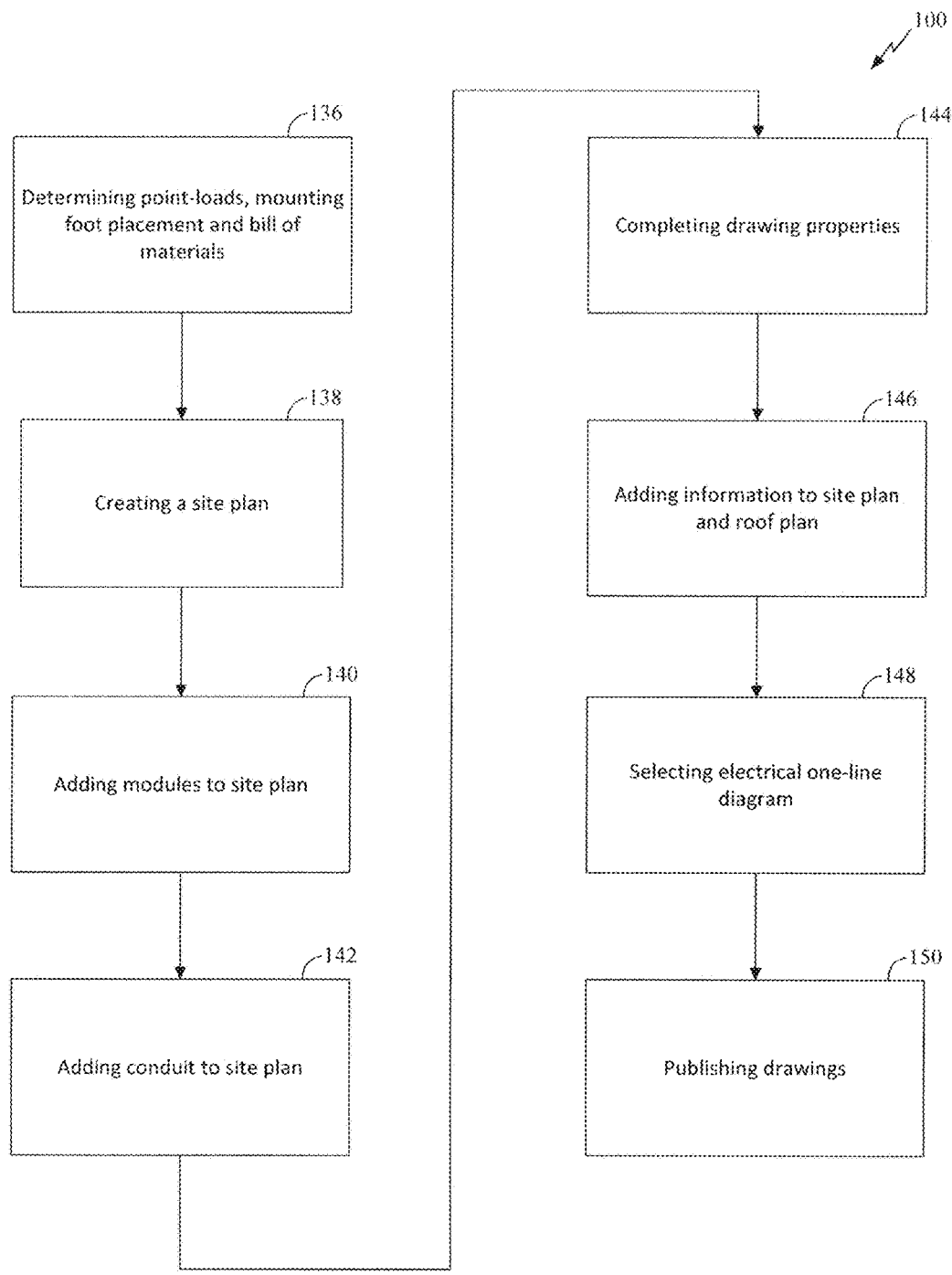
Figure 2:
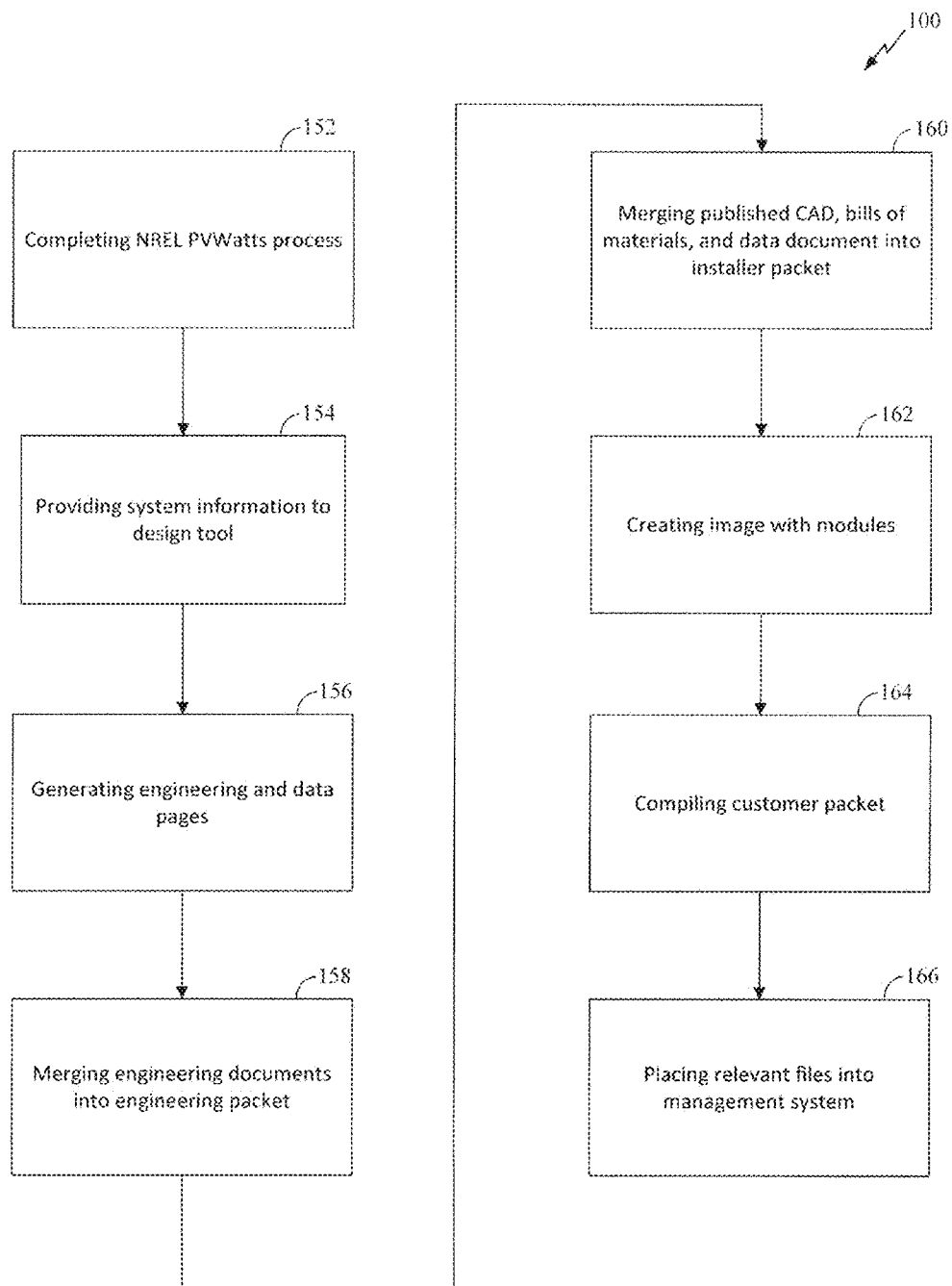
Figure 2:
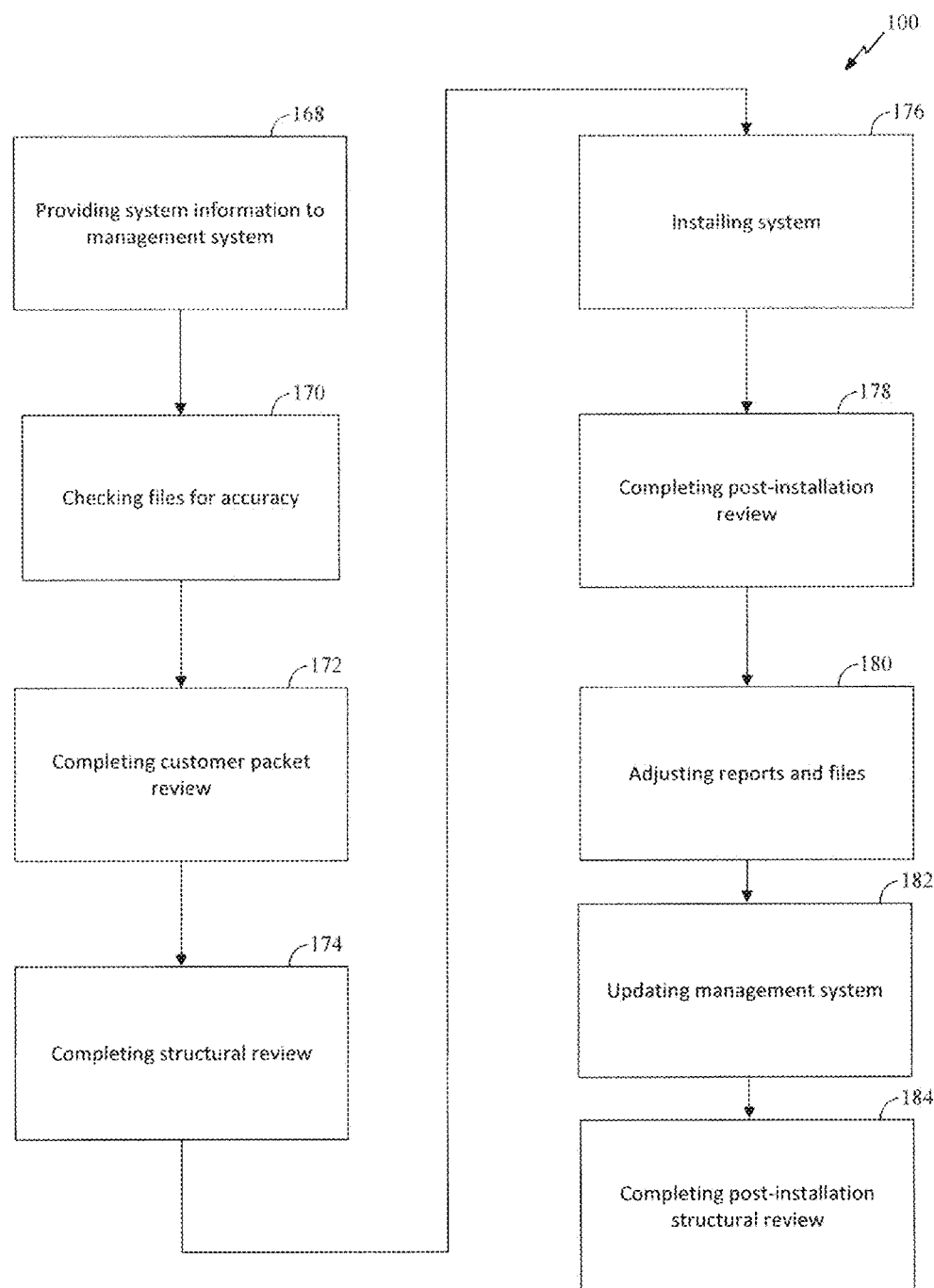

FIG. 2 is a flowchart illustrating a process 100, in accordance with an embodiment of the present disclosure. Process 100 includes various acts that may be performed during installation of a photovoltaic system. It is noted that although the acts of process 100 are presented in a specific order, the present disclosure does require that the acts be performed in the disclosed order, or any other sequential order. Rather, the acts described herein may be performed in any suitable order, as will be appreciated by a person having ordinary skill in the art. It is further noted that process 100 does not require each disclosed act for performing a photovoltaic installation process.

With reference to FIGS. 2-38, process 100 will now be described. Process 100 may include completing a site survey (depicted by reference numeral 102), which may include gathering various information ("site survey information") about a job site (e.g., a residential or commercial structure). For example only, site survey information may include, but is not limited to, customer information, electrical information, attic information (except in the case of finished attics or exposed beam ceilings), and roof illustrations (e.g., one illustration for each roof section surveyed) including roof measurements (e.g., a run measurement), roof obstruction locations, and sky picture locations (i.e., photos of the sky at different locations on the roof) (e.g., 4 or more per roof section). Moreover, for each sky picture location marked on the site survey, a full resolution image (e.g., a ".jpg" image thumbnail) and ".sky" file may be obtained. Site survey information may further include one or more photographs. For example, the site survey information may include one or more photographs of the structure (e.g., full frontal photographs of the structure), one or more editable (e.g., "Photoshop-able") photographs, one or more photographs of a power meter (e.g., from 25 feet away, a close-up (i.e., close enough to read meter number)), one or more photographs of an electrical utility bill (i.e., with name, account number and/or electrical usage graph), and/or one or more photographs of an additional utility bill, if more than one meter exists. In addition, the site survey information may include one or more photographs of an electrical panel and/or subpanel(s) (e.g., a photograph taken from 15 feet away, a close-up photograph of entire bus bar so all breaker ratings can be read, a photograph of a panel rating sticker, and a photograph of a main disconnect). Furthermore, the site survey information may include one or more roof-top photographs (e.g., 1 or more per roof section), one or more general attic photographs, one or more photographs of a rafter illustrating rafter size, rafter spacing, rafter lumber grade stamp, or a combination thereof. Moreover, if the structure (e.g., a house) includes a finished attic, one or more photographs of a finished drywall ceiling may be included in the site survey information.

Figure 3:
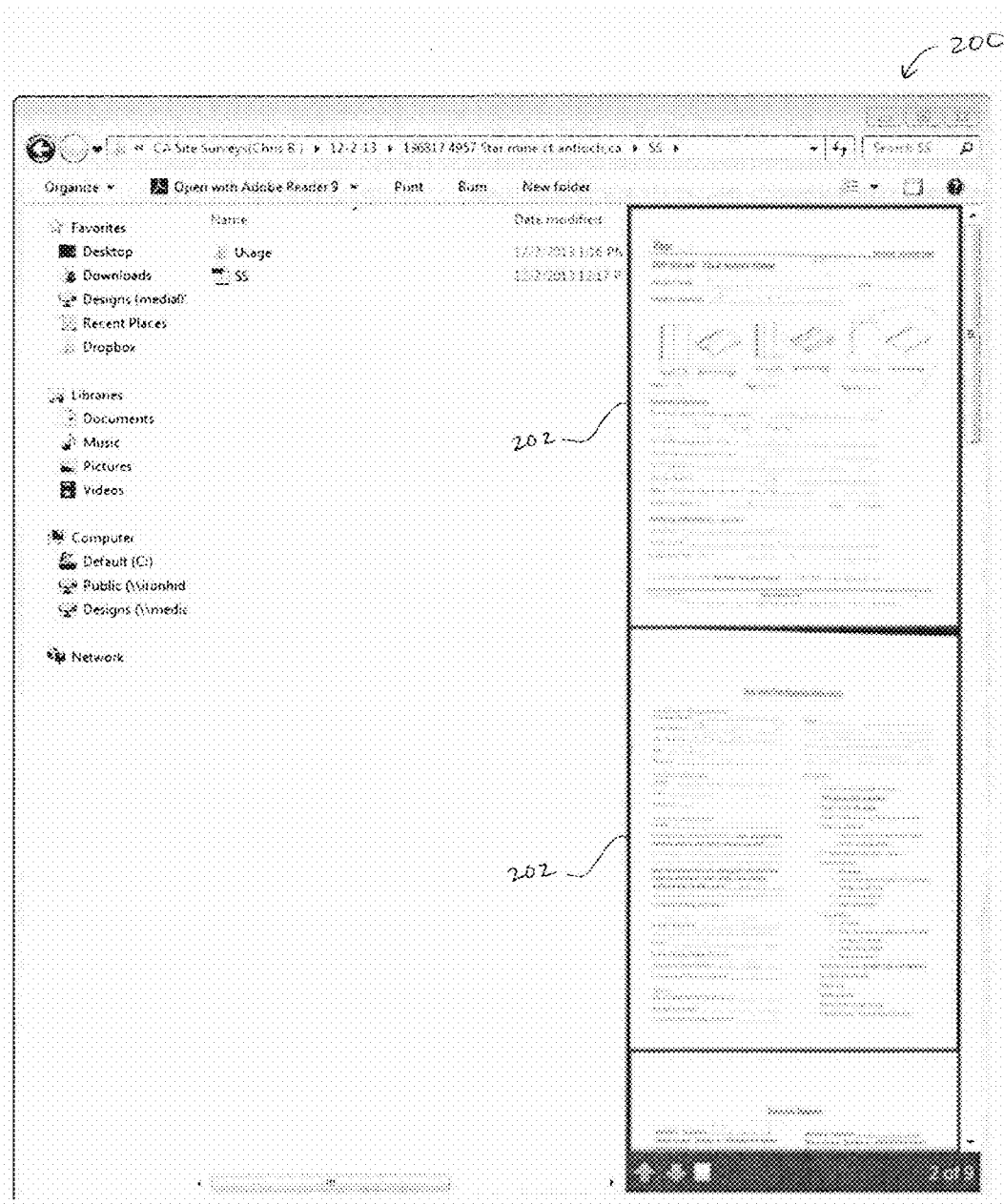
FIG. 3 is a screenshot depicting example documents of a site survey.

Further, site survey information may include a customer utility bill and usage information (e.g., customer name, electrical service address, customer account number, electrical meter number (i.e., that matches the meter number in a site survey photograph), schedule rate, discounts customer has qualified for, tiered usage graph, and electricity usage history (e.g., four or more months of history). It is noted that the tiered usage information (e.g., a tiered usage graph) may only be required for certain electric companies (e.g., Southern California Electric and San Diego Gas and Electric). The site survey information may be stored in one or more electronic files and uploaded to a central accessible database (e.g., Dropbox). FIG. 3 is a screenshot 200 depicting various example documents 202 included in a site survey.

In addition, process 100 may further include verifying that a site survey includes all necessary files and information to at least begin a photovoltaic installation process (depicted by reference numeral 104). According to one embodiment, a technician (e.g., a pre-design technician) may verify that the site survey includes all necessary files and information.

Figure 4:
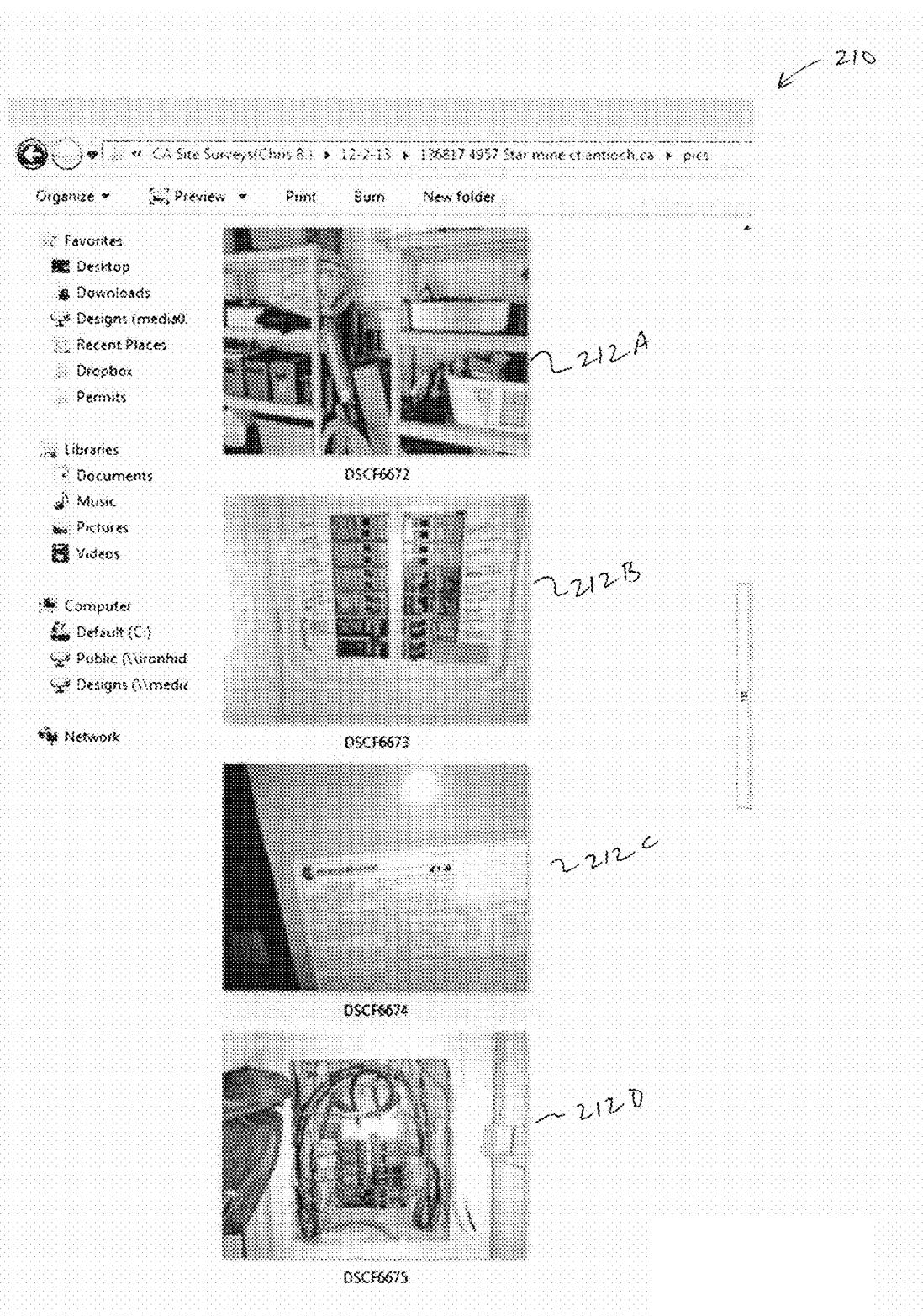
FIG. 4 is a screenshot depicting example photographs used in determining a method of interconnection for a photovoltaic system.

Process 100 may further include determining a method of interconnection to an electrical panel in accordance with local electrical codes (depicted by numeral 106). According to one embodiment, a technician (e.g., a pre-design technician) may determine a method of interconnection to the electrical panel. The method of interconnection may be at least partially based on one or more electrical photographs from the site survey. FIG. 4 is a screenshot 210 including example photographs 212A-212D that may be used in determining a method of interconnection.

Interconnection methods may include utilizing an "interior load breaker" connection wherein a main electrical panel includes a main disconnect and a main electrical panel bus bar has unused space or a breaker that can be consolidated to make room for the solar breaker. Another interconnection may include an "existing subpanel" connection wherein a main electrical panel includes a main disconnect, a main bus bar does not include space for a solar breaker, and an electrical subpanel has unused space or a breaker that can be consolidated to make room for the solar breaker. Yet another interconnection includes a "new subpanel." This connection may be used when a main electrical panel includes a main disconnect, a main bus bar does not include space for a solar breaker, a new electrical subpanel is installed according to code specifications, one breaker is moved from the main electrical panel to the new electrical subpanel to make room for a new subpanel disconnect, and the solar breaker is placed on a new subpanel bus bar.

A "supply tap," which is another interconnection, includes an electrical tap attached to supply wires inside a main disconnect box. The electrical tap may require at least 6 inches of supply wire. It is noted that that the supply tap connection may only be an option in certain geographical regions (e.g., East Coast of the United States). Another example, is a "supply breaker" connection, which is a connection wherein an electrical meter connects directly to a small bus bar, which includes breakers to a main electrical panel and other things. Further, in this connection, a small bus bar has used space or a breaker that can be consolidated to make room for a solar breaker, and the supply breaker includes six or fewer disconnects on the small bus bar. In addition, an interconnection may include a "re-directed main" connection. In this connection, an electrical meter connects directly to a supply side bus bar, the supply side bus bar includes breakers to a main electrical panel and other components. Moreover, in this connection, the supply side bus bar does not include space for a solar breaker, the main disconnect is moved from the supply side bus bar to a new subpanel, and a solar breaker is placed on the new subpanel bus bar.

Regardless of a type of interconnection, if a main disconnect is located in the center of the bus bar and has an equivalent rating to the bus bar, a 100% multiplier, instead of a standard 120% multiplier, may be required to determine available amps. In these cases, interconnection may not be available.

Figure 5:
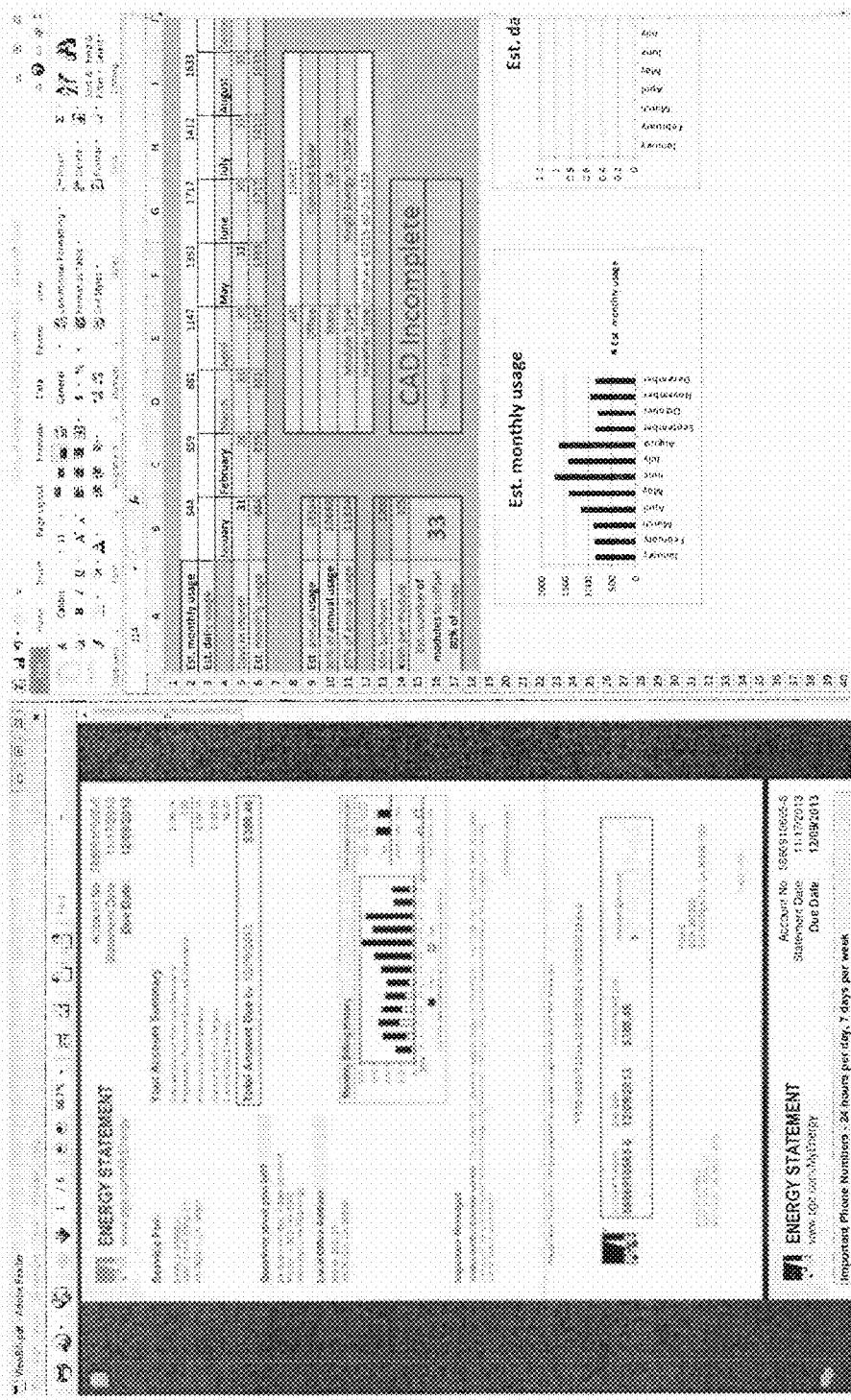
FIG. 5 is a screenshot illustrating an energy statement and a software design tool.

Process 100 may further include determining an ideal usage offset-to-savings ratio and estimating the number of modules necessary to meet that offset (depicted by numeral 108). According to one embodiment, a technician (e.g., a pre-design technician) may determine an ideal usage offset-to-savings ratio and estimate the number of modules necessary to meet that offset. The ideal usage offset-to-savings ratio may be substantially equal to the amount of power generated by the photovoltaic system relative to the amount of power used by the residence. For example, if a structure (e.g., a house) is using 100 kilowatt hours per month and the photovoltaic system is generating 80 kilowatt hours per month, the offset-to-savings ratio is equal to 80%. By way of example, some general rules of determining usage offset percentages may include a default offset of 80%, a usage offset of 100% in Hawaii, and a 5% minimum required annual savings. It is noted that the offset should be maximized and, according to one non-limiting embodiment, a minimum of six solar modules may be used. It is further noted that determining usage offset percentages may incorporate an annual savings calculator, which incorporates one or more parameters (e.g., different utility rates and utility discounts). Further, the number of modules estimated may be calculated based on a customer's annual usage divided by a module rating. FIG. 5 illustrates a screenshot 220 of an energy statement 222 and a software design tool 224.

As will be appreciated by a person having ordinary skill in the art, a handheld device (e.g., a Solmetric SunEye device developed by Solmetric Corp. of Sabastopol, Calif.) may include an integrated electronic compass, tilt sensing technology, GPS, and camera. The handheld device allows for photographs of the sky to be taken at different locations on a roof of a structure. Further, the handheld device may include built-in features to integrate roof tilt, azimuth, location, and shading information into the photographs. The photographs may estimate the shading; however, these estimates, which may be shown as coloring on a photograph, often need adjustment (e.g., by a design technician) to ensure the optimal accuracy. The combination of all photographs and information on a given roof is compiled into a "session" that is accessible and editable through software (e.g., PV Designer software developed by Solmetric Corp.).

Process 100 further includes setting up a customer design folder (i.e., via moving over a site survey form, one or more photographs, and a session (e.g., a Solmetric SunEye session developed by Solmetric Corp) from a site survey folder and generating a design tool (depicted by numeral 110). According to one embodiment, a technician (e.g., a pre-design technician) may set up a customer design folder and generate a design tool for a design technician. A design tool, which may include and/or utilize at least a portion of application program 56, data 58, and processor 52 (see FIG. 1), may contain information specific to the customer's account and location-specific information on pre-design, design, and computer-aided design (CAD) requirements (e.g., roof offset requirements, interconnection options, additional steps, etc.). The design tool may also contain formulas and calculators for engineering, usage, and verification calculations (e.g., point-load, estimated number of modules, customer savings, ideal usage offset-to-savings ratios, etc.). The design tool may include any data that may be valuable to a designer. As one example, the design tool may include data for various codes and/or requirements for various cities, states, and/or home owners associations (HOAs). Further, National Electrical Code (NEC) and California Electrical Code (CEC) calculations may be included within the design tool. According to one embodiment, a number of modules may be provided to the design tool, which may then calculate various parameters, such as required wire gauges, breaker sizes, and voltage drops.

The design tool may be configured to generate one or more documents for use in permitting and installation. For example, the design tool may generate a data document, which includes information on system materials and costs, and an engineering document, which includes point-load and electrical information.

Figure 6:
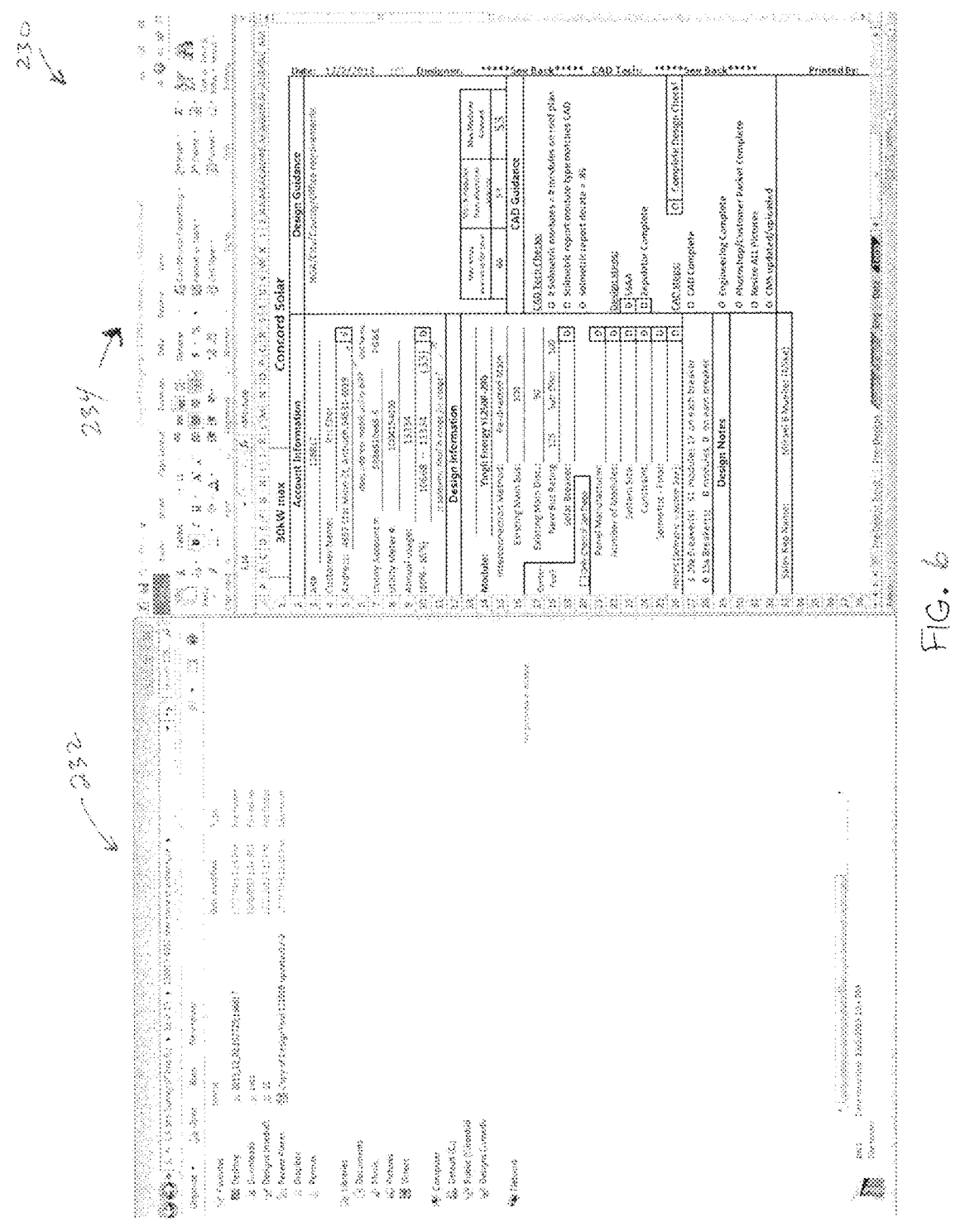

Once CAD requirements are complete, the customer design folder may include a sub-folder including the session files (e.g., Solmetric SunEye session files), photographs taken by a site surveyor (e.g., within a sub-folder), a site survey form (e.g., within a sub-folder), a CAD drawing file specific to a customer's account, a design tool specific to a customer's account, an estimated production report (e.g., an estimated production report generated by Solmetric Corp.), one or more PDF files, or any combination thereof. The one or more PDF files may include published CAD files, a customer packet, an engineering packet, an installer packet, engineering information, bill of materials, a design tool printout, or any combination thereof. Further, the customer design folder may include a modified (e.g., "Photoshopped") image of one or more modules on a structure (i.e., when a good image is available), any previous design options (e.g., if a redesign has been performed), relevant notes or correspondence (e.g., when exceptions are made or when special cases arise), or any combination thereof. FIG. 6 is a screenshot 230 depicting an example customer design folder 232 and a software design tool 234.

Figure 7:
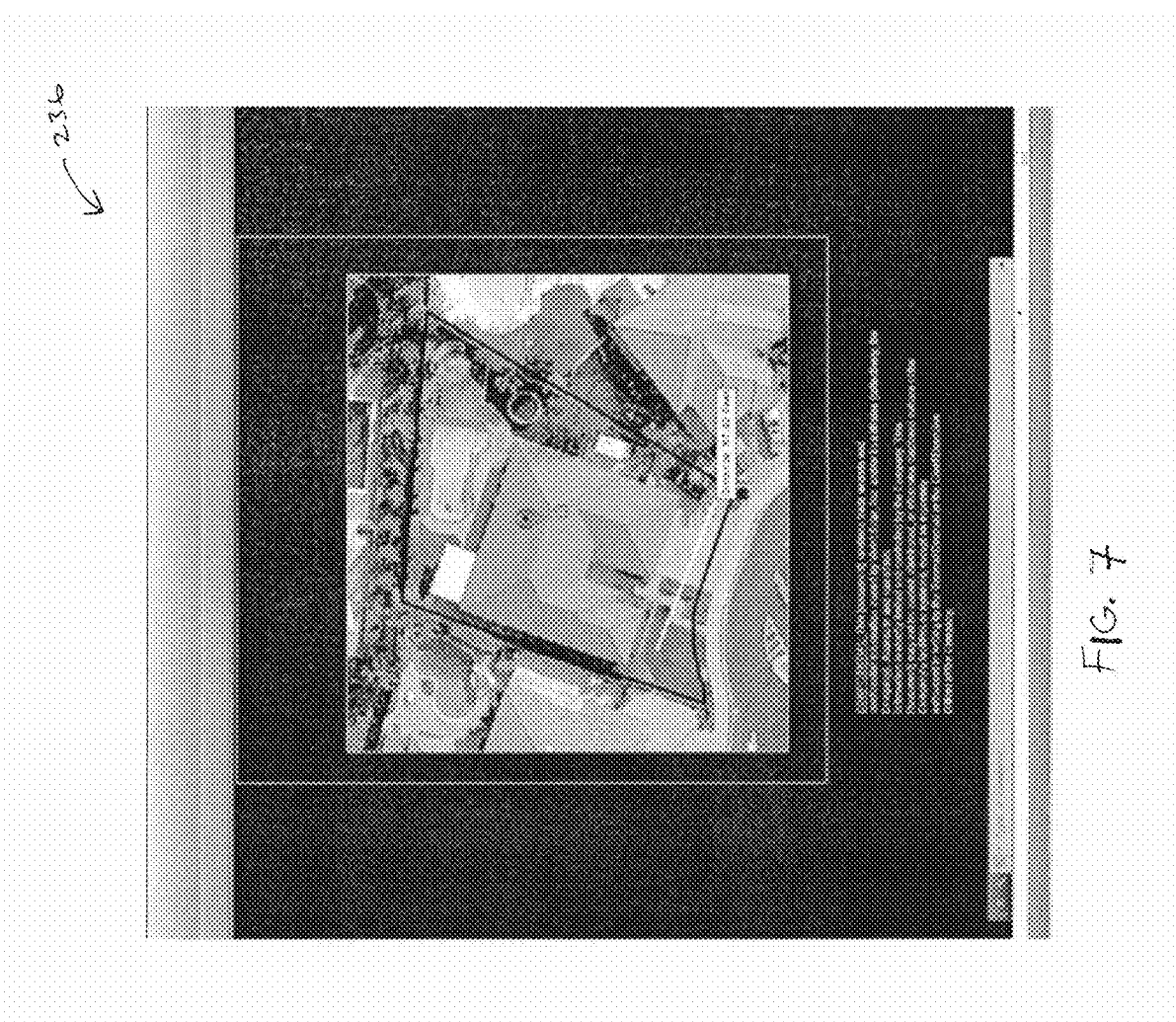
FIG. 7 is a screenshot depicting an aerial photograph of a property including a structure.
Figure 8:
FIG. 8 is a screenshot depicting another aerial photograph of the property shown in FIG. 7.

Process 100 may further include obtaining one or more aerial photographs of the structure (depicted by numeral 112). For example only, a design technician may obtain one or more aerial photographs of the structure (e.g. a house). By way of example only, one or more aerial photographs may be obtained via an online repository of to-scale aerial photographs. As a more specific example, aerial photographs may be obtained via "Pictometry Online," which is an online repository of to-scale aerial photographs and includes advanced measurement tools that are useful for obtaining highly accurate azimuth and distance calculations. "Pictomerty Online" is developed by Pictometry International Corp. of Rochester, N.Y. Based on the one or more aerial photographs, azimuth may be calculated. As will be understood by a person having ordinary skill in the art, azimuth is an angular measurement of the direction a roof is slanting in degrees clockwise from North (e.g., if the roof slants to the South, the Azimuth would be 180°, and a roof slanting to the East would have an Azimuth of 90°). Furthermore, the photographs may be scaled into a CAD file. FIGS. 7 and 8 respectively include screenshots 236 and 238, each of which include an example aerial photo obtained via an online repository.

Figure 9:
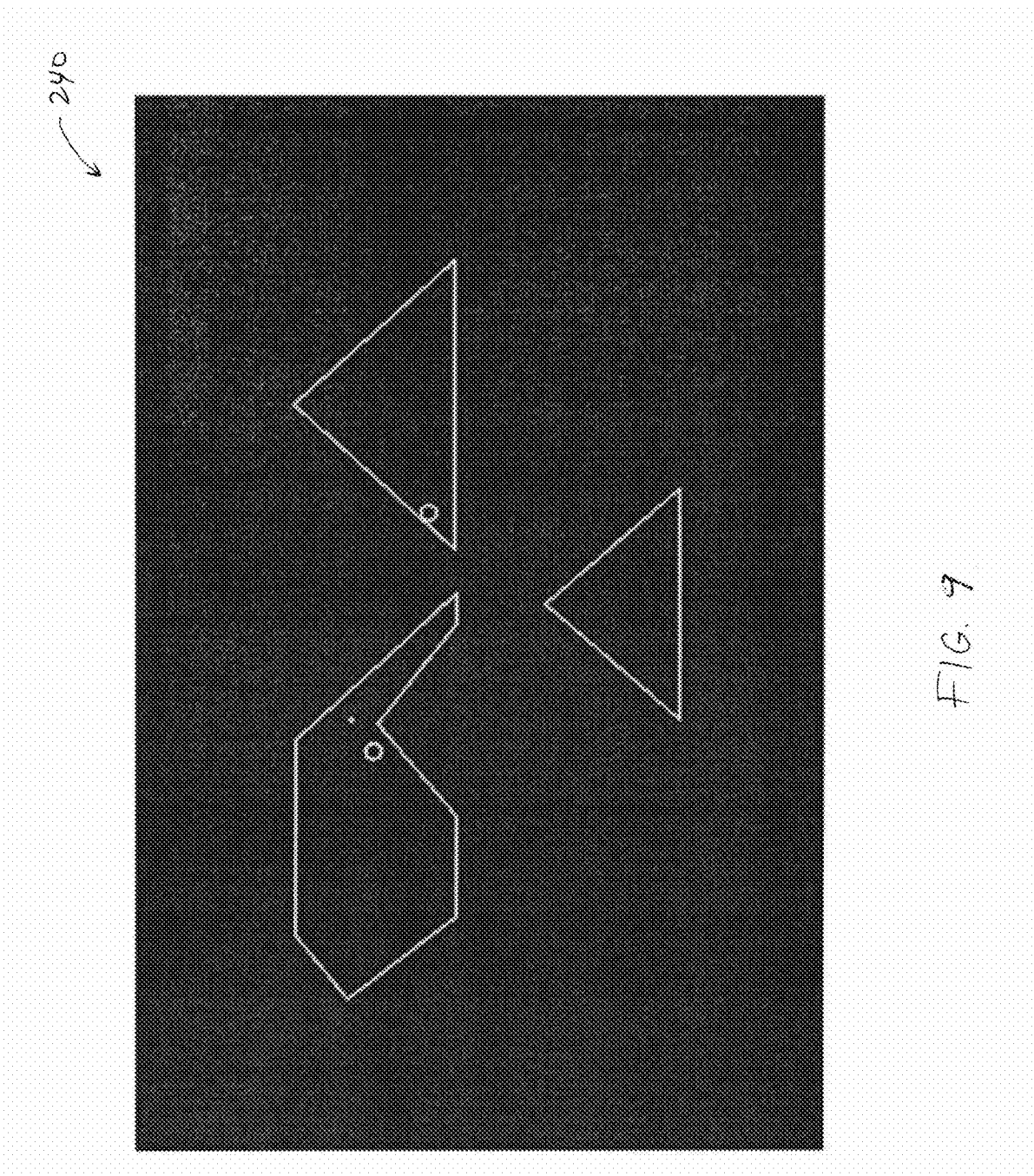
FIG. 9 is a screenshot depicting example roof plans for a photovoltaic system.

Process 100 can also include generating, via roof measurements and tilt information from the site survey, an illustration of each roof section in order of approximated production efficiency (e.g., most south-facing, east-facing, west-facing, then north-facing factoring in possible shading) in a detailed, to-scale, roof plan (depicted by numeral 114). For example only, a design technician may generate an illustration of each roof section in order of approximated production efficiency. The roof plan may be generated (e.g., drawn) based on the site survey measurements. The actual measurements on the roof illustration(s) in the site survey form may be followed as closely as possible. These illustrations may provide the most accurate, to-scale representation of the actual placement of the modules on the roof of the structure. FIG. 9 is a screenshot 240 depicting example roof plans.

Figure 10:
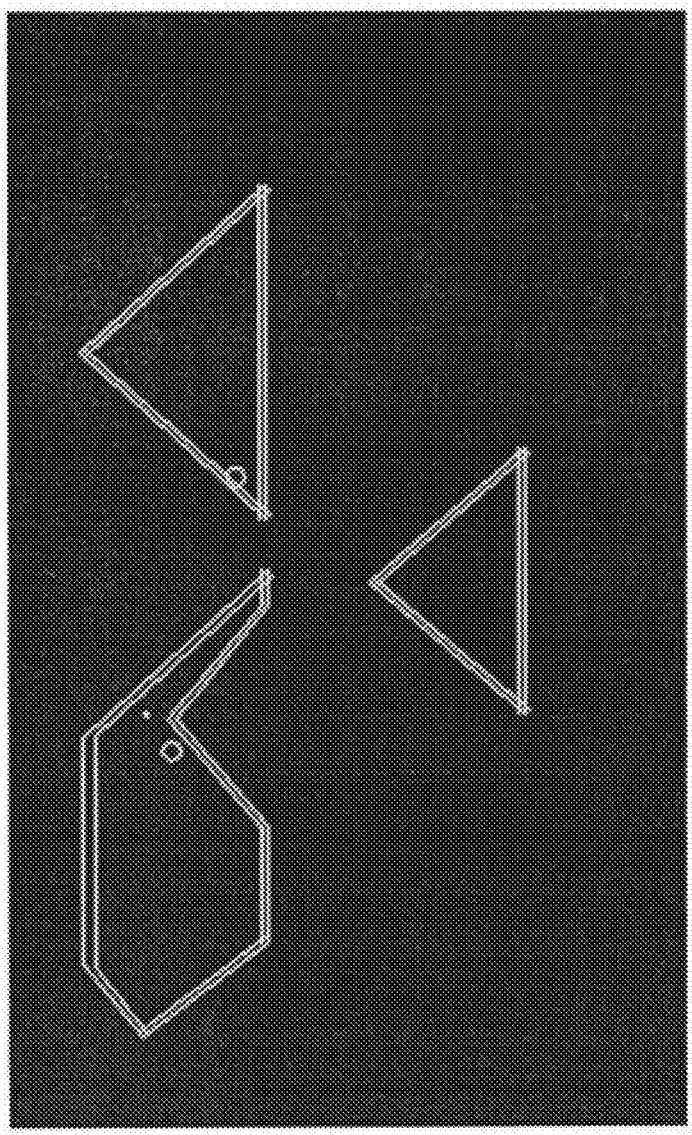
FIG. 10 is a screenshot illustrating example roof plans with required offsets.

Process 100 may also include applying required offsets to each illustrated roof section (depicted by numeral 116). For example only, a design technician may apply required offsets to each illustrated roof section. Roof offset requirements may include a standard offset requirement (e.g., minimum offset of fifteen inches from every ridge and eight inches from all other sides), jurisdictional requirements, or both. Jurisdictional requirements may include, for example, the "California Fire Code" requirement (i.e., currently—minimum three foot wide offset from ridge to top edge of an array, minimum three foot wide offset between an edge of an array and a load bearing wall, and a minimum eighteen inch offset between an edge or corner of an array and any hip or valley where modules are located on both sides of the hip or valley. If modules are only on one side, no offset is required). Further, another jurisdictional requirement may include a "Simi Valley" requirement (i.e., currently—minimum four foot offset from any edge running perpendicular to an eve). In addition, other offset requirements for Hawaii (i.e., currently—one foot offset from all plumbing vents), New York (i.e., currently—eighteen inch offset from one side of a ridge and eighteen inch offset from one side running perpendicular to the eve), and Ontario (i.e., currently—three foot offset from all four sides) may exist. FIG. 10 is a screenshot 245 including example roof plans including required offsets.

Figure 11:
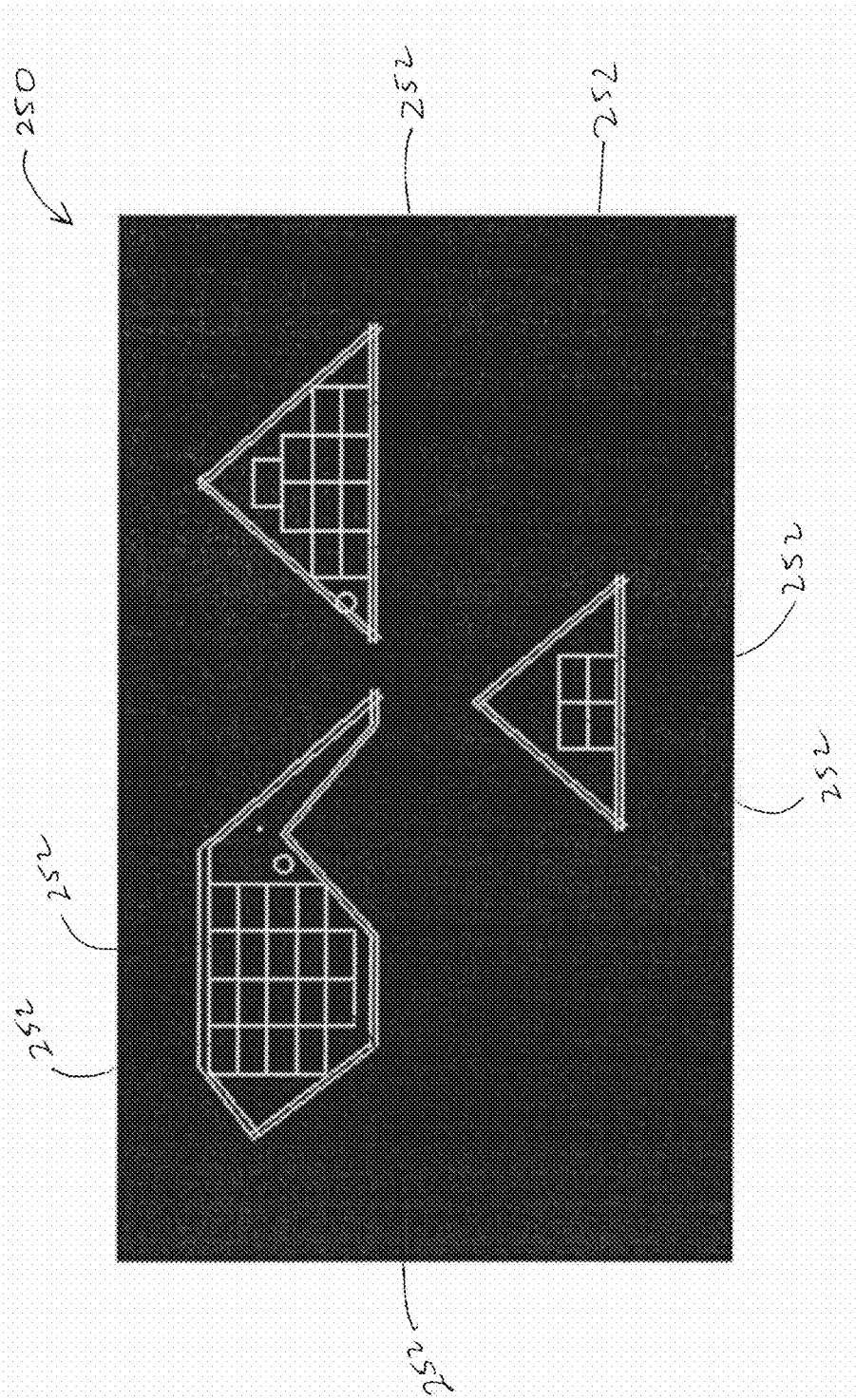
FIG. 11 is a screenshot depicting example roof plans including a plurality of modules.

Process 100 may further include providing a sufficient number of modules on an illustration (e.g., drawing) to either fill all surveyed roof sections, meet the number of modules estimated (i.e., by the pre-design technician), or both (depicted by numeral 118). For example only, a design technician may provide a sufficient number of modules on an illustration. FIG. 11 is a screenshot 250 including example roof plans including a plurality of modules 252 to fill all surveyed roof sections and/or meet the number of modules estimated.

Figure 12:
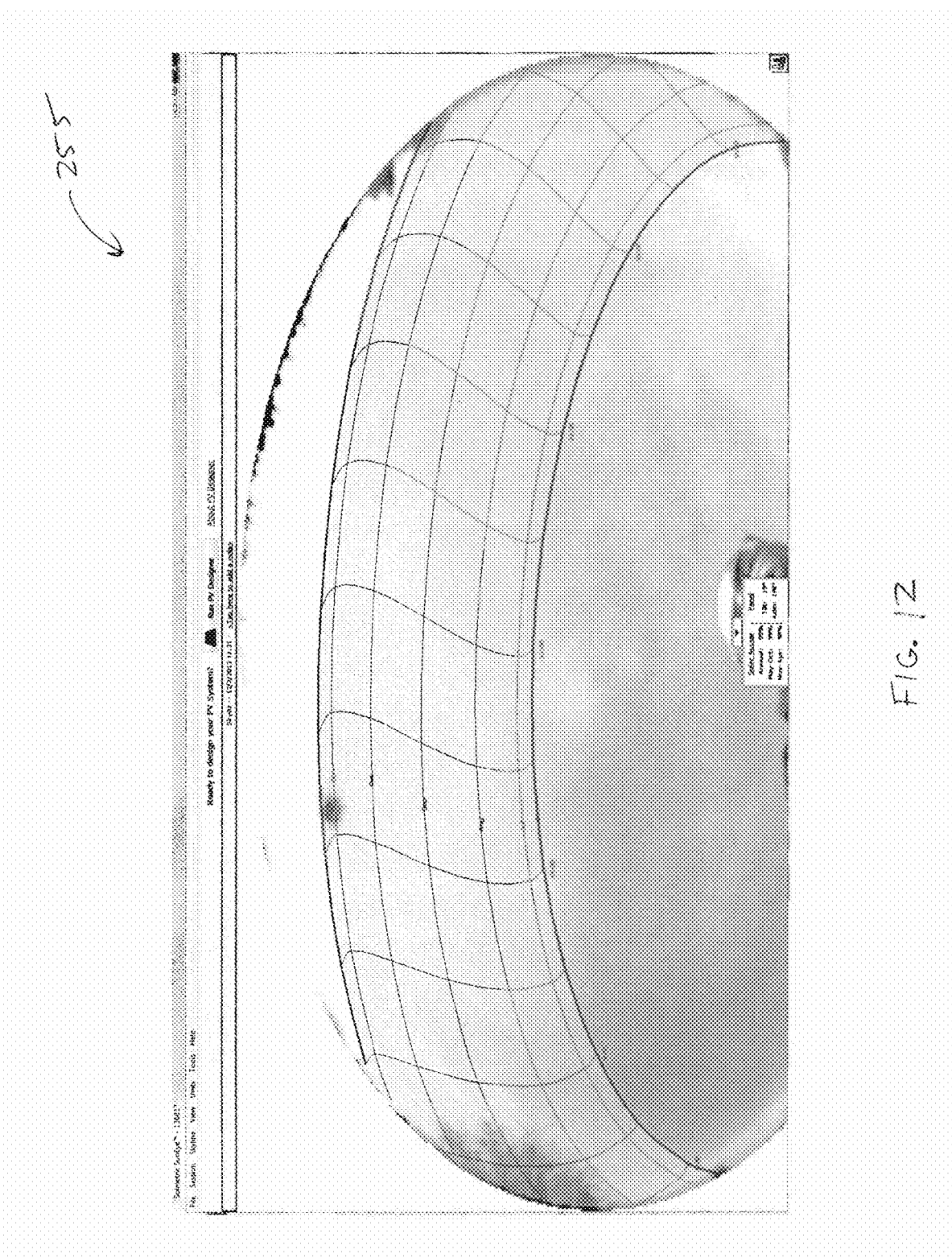
FIG. 12 is a screenshot illustrating a sky photograph.

In addition, process 100 includes adjusting previously taken photographs (i.e., photographs of the sky at different locations on the roof) (depicted by numeral 120). For example only, a design technician may adjust the previously taken photographs (e.g., Solmetric SunEye photographs). FIG. 12 is a screenshot 255 including a sky photograph.

Figure 13:
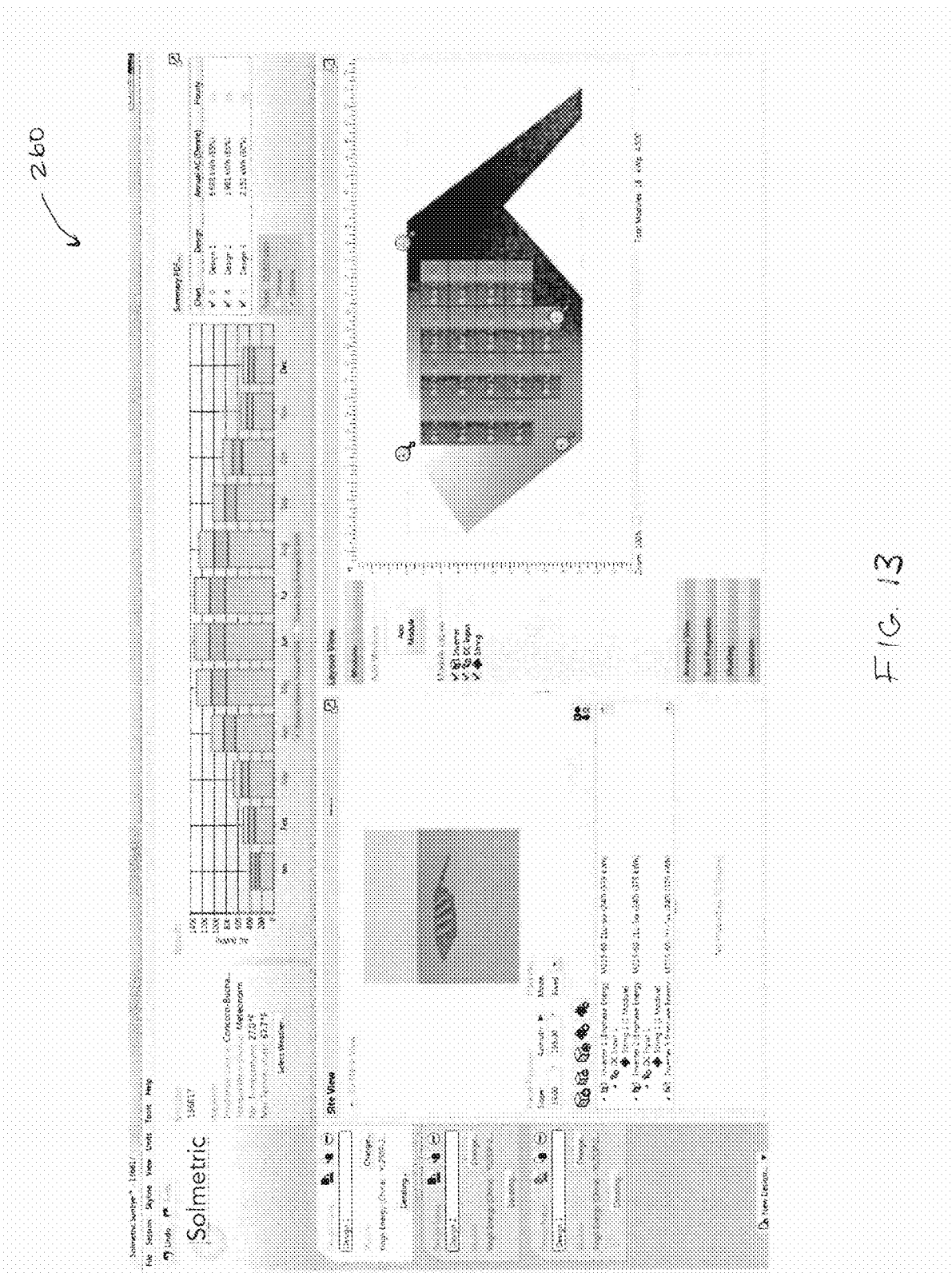
FIG. 13 is a screenshot illustrating a roof plan generated in a software tool.

In addition, process 100 may include recreating roof sections via an application tool (e.g., a software program) (depicted by numeral 122). As an example, a design technician may recreate the roof sections. By way of example only, roof sections may be recreated via Solmetric's PV Designer software, which may be used (e.g., by a design technician) to calculate estimated production of modules in any given area. The PV Designer software has tools for drawing a roof section, placing modules, and placing SunEye picture locations. The software may use location-specific weather information to calculate estimated solar access and production for each module, roof section, and for an entire solar array. Further, the software calculates estimated production levels for each module, roof section, and for the entire photovoltaic system. FIG. 13 includes a screenshot 260 including a roof plan generated via an application tool.

Process 100 may further include calculating a number of estimated "sun hours" for each roof section and comparing the estimation against required production levels (depicted by numeral 124). The term "sun hours" represents the number of hours of exposure a module or an array of modules will have to the sun annually. The number of sun hours may be calculated by dividing the estimated system production by the system size. Sun hour requirements may vary depending on a geographic location. For example, in California, 1300 sun hours per year is considered low, and 1150 sun hours or less per year may result in an automatic subscription cancellation. Further, in Maryland, 1100 sun hours per year is considered low, and 1000 sun hours or less per year may result in an automatic subscription cancellation. In addition, for New York, Massachusetts, Hawaii, and New Jersey, 1000 sun hours per year is considered low, and 950 sun hours or less per year may result in an automatic subscription cancellation. It is noted that a system (i.e., an account) may be approved or rejected based on a sun hour estimation. By way of example only, if a roof section's calculated sun hours falls between the automatic cancellation and low sun hours specifications, but the system's sun hours are above the low sun hour minimum, then further consideration (e.g., further calculations) may be taken into account to determine if approval is necessary. Further, if all individual roof sections are within 95% of the low sun hour minimum, the system may be approved. If any of the individual roof sections fall under 95% of the low sun hour minimum, further consideration may be necessary (e.g., by a department head) for approval of the system.

Figure 14:
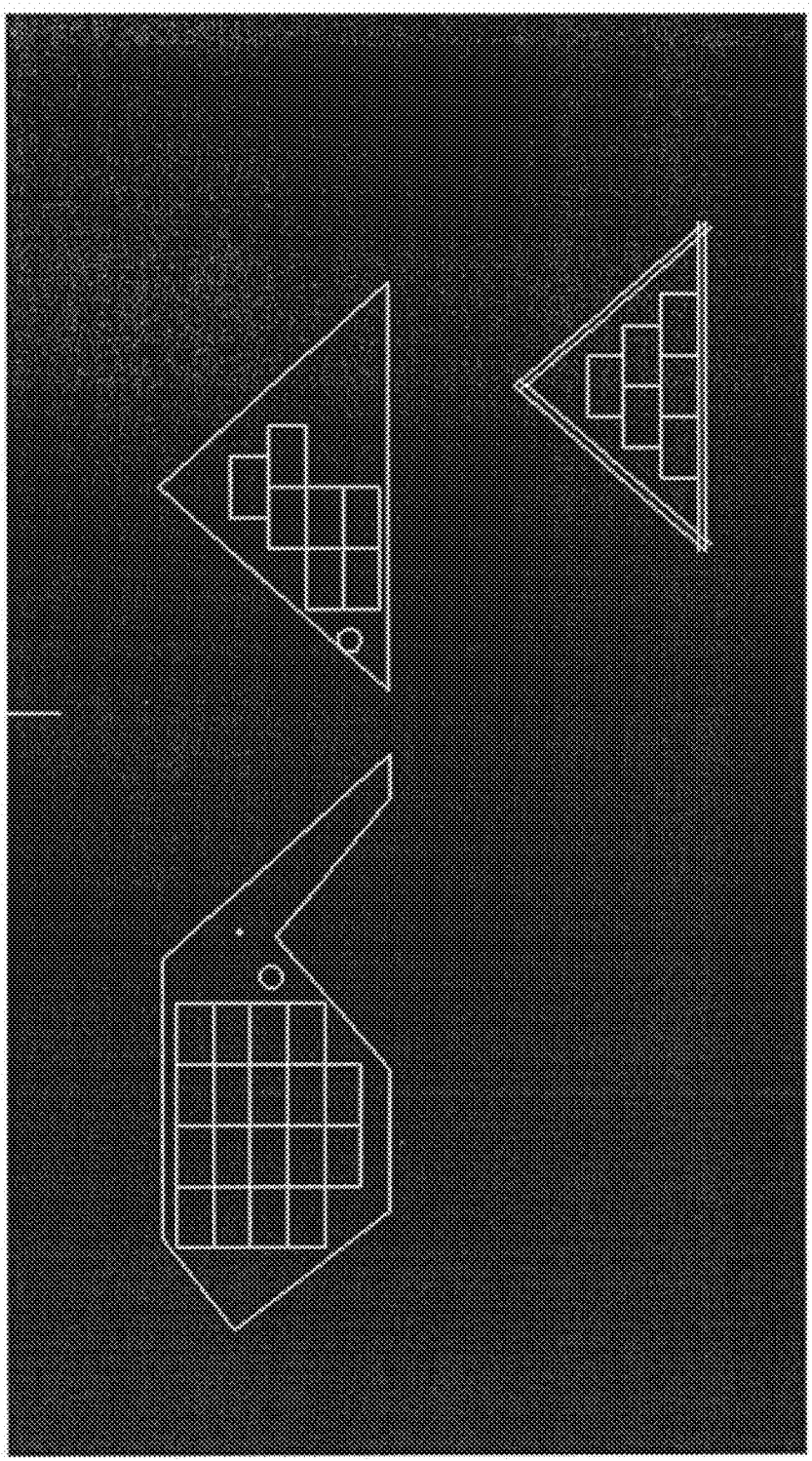
FIG. 14 is a screenshot depicting example roof plans including a plurality of modules.

Process 100 includes fine-tuning the number of modules to match, as closely as possible, an ideal offset previously specified (depicted by numeral 126). As an example, a design technician may fine-tune the number of modules. FIG. 14 includes a screenshot 270 illustrating an example roof plan including a fine-tuned number of modules.

Further, process 100 includes adding trunk cable and hatching to a roof plan to indicate separate circuits (depicted by reference numeral 128). As an example, a design technician may add trunk cable and hatching. According to one embodiment, up to seventeen modules can be placed on each circuit. A one-circuit system may connect to the junction boxes, then directly to a main bus bar solar breaker. A multi-circuit system may have all circuits connected to the junction boxes, then to individual breakers in a combiner panel, which then connects to a main bus bar solar breaker. In one specific embodiment, some module circuits may be coupled to a 15A breaker, and some other module circuits may be coupled to a 20A breaker. Further, up to eight modules may be coupled to a 10A breaker, if required.

Figure 15:
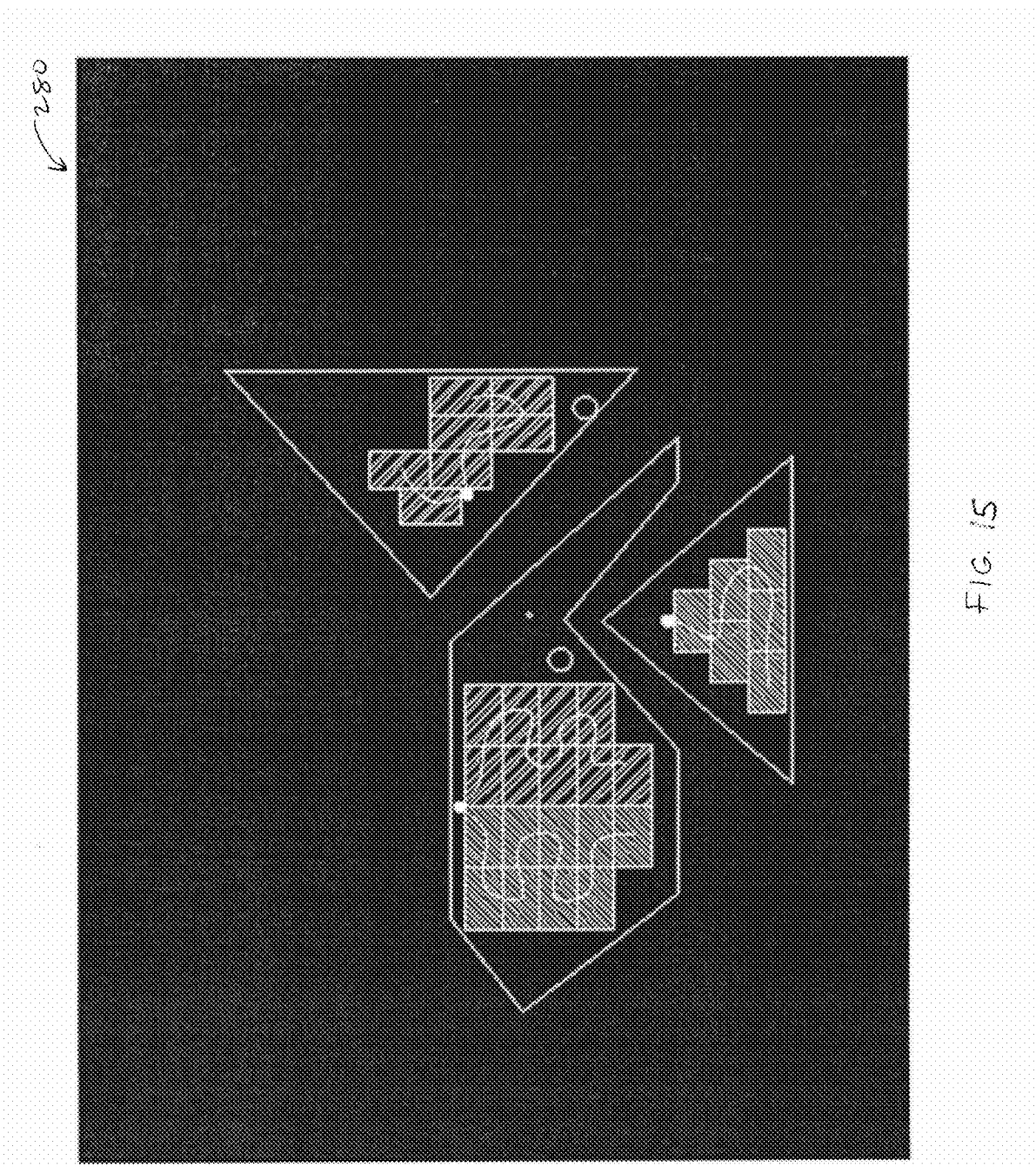
FIG. 15 is a screenshot depicting example roof plans including a plurality of modules, trunk cable, and hatching.

For trunk cable addition, "splines" may be placed on the roof plan (e.g., by the design technician) to represent a trunk cable connecting DC-AC inverters, in circuits, to the junction boxes (e.g., up to ten landscape-oriented modules may be on the same spline and up to thirteen portrait-oriented modules may be on the same spline). Splines may originate at a junction box and end at a module, as an example. Further, for example, splines may traverse across modules, then down. FIG. 15 includes a screenshot 280 depicting a roof plan including a number of modules, trunk cable, and hatching.

Figure 16:
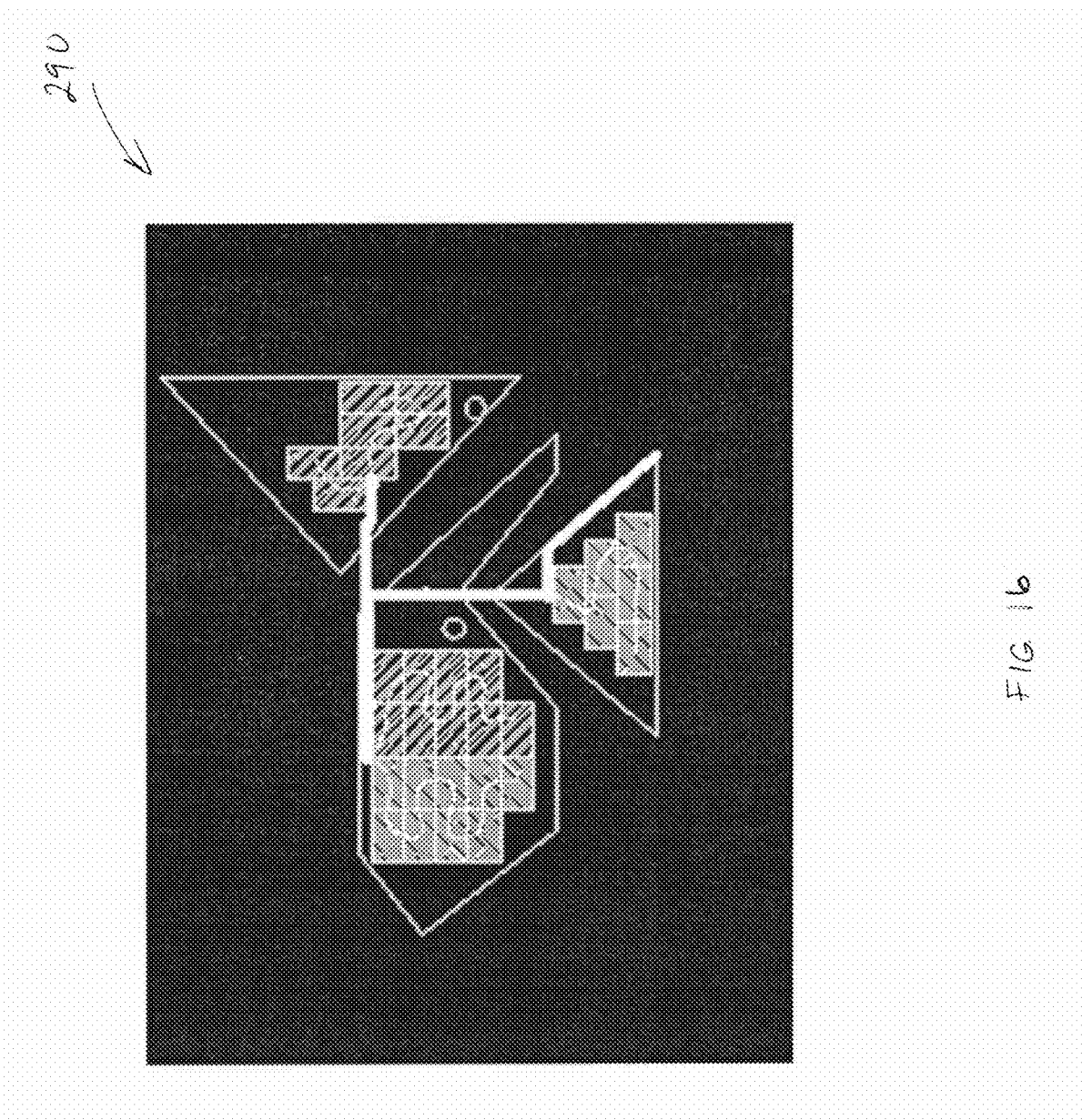
FIG. 16 is a screenshot depicting example roof plans including a plurality of modules, trunk cable, hatching, and a conduit.

Process 100 may also include adding one or more conduits to a roof plan (depicted by numeral 130). As an example, a design technician may add one or more conduits to a roof plan. A conduit may be shown on both the site plan and the roof plan to represent the actual conduit on the roof that will contain the electrical wiring between junction boxes and the electrical panel or combiner panel. It is noted that conduit should be kept to a minimum length possible to avoid power loss due to a voltage drop. Further, a conduit visible from the street is to be avoided wherever possible, and conduit may run as close to the ridge as possible. FIG. 16 is a screenshot 290 illustrating roof plans including a number of modules, trunk cable, hatching, and a conduit.

Process 100 may also include determining one or more constraints for the photovoltaic system (depicted by numeral 132). For example, a design technician may determine one or more constraints. A "customer usage" constraint is reached when the estimated production of the system has reached the desired offset percentage. With this constraint, the customer is receiving the ideal savings according to their usage. A "max kW" constraint is reached when the system size reaches a locally-enforced photovoltaic system size limit. A "roof space" constraint is reached when there is no further space to place modules on any of the roof sections surveyed. An "electrical" constraint is reached when the number of modules is limited by the electrical capacity of the structure. A system may be designed and can be installed with the electrical constraint, but if the customer chooses to upgrade his/her electrical system, the system may be redesigned, after a new site survey, to reflect the new electrical requirements. A "solar access" constraint is reached when the placement of more modules is limited by the estimated production in an area of the roof. The solar access constraint can sometimes be remedied by the removal of trees or other obstructions. In such cases, a new site survey may be required before a redesign will be considered.

Figure 17:
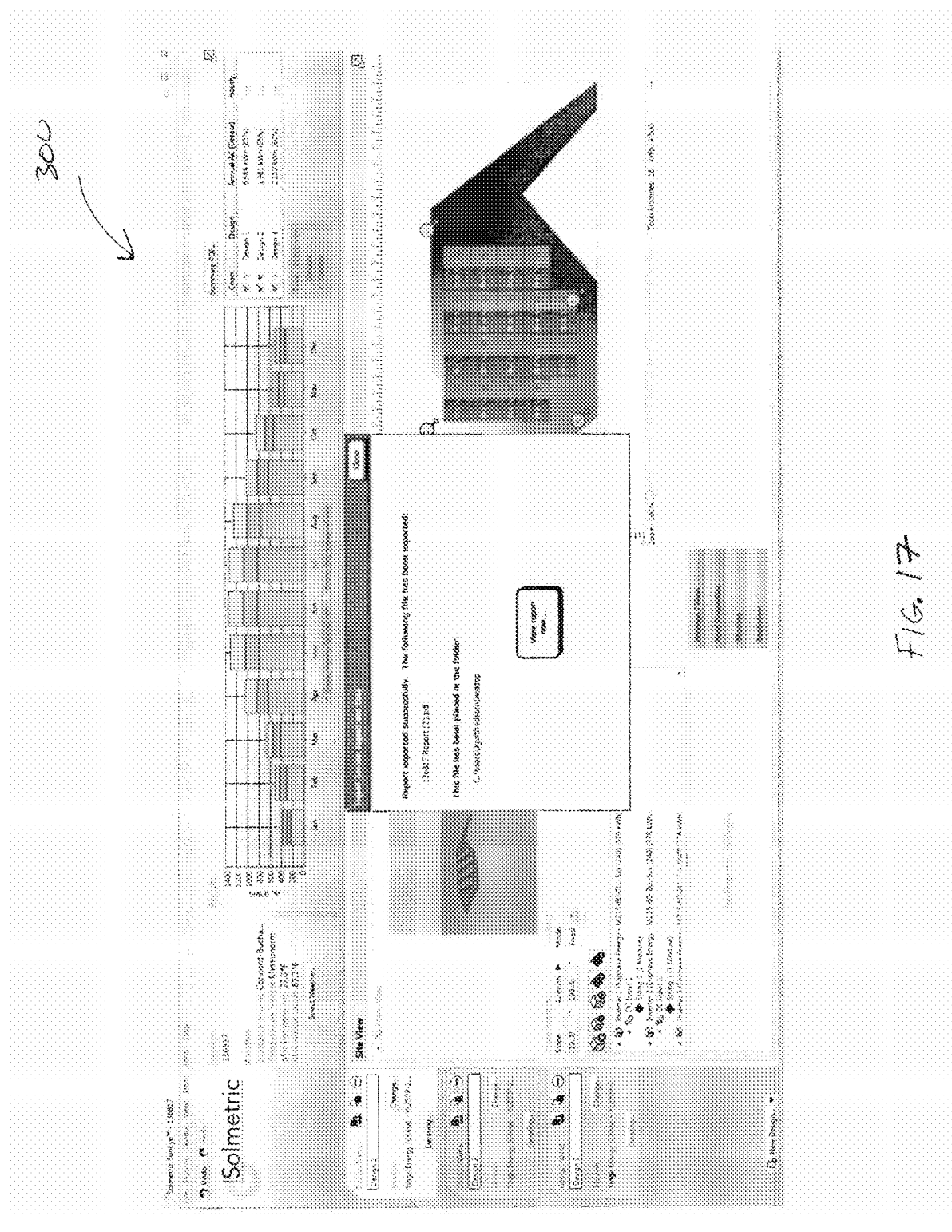
FIG. 17 is a screenshot illustrating example shading reports and production estimates for a photovoltaic system.

Process 100 may further include generating, and possibly printing, shading reports (e.g., Solmetric shading reports) and production estimates (depicted by numeral 134). According to one example, a design technician may generate, and possibly print shading reports and production estimates. FIG. 17 includes a screenshot 300 depicting an example shading report and an example production estimate.

Figure 18:
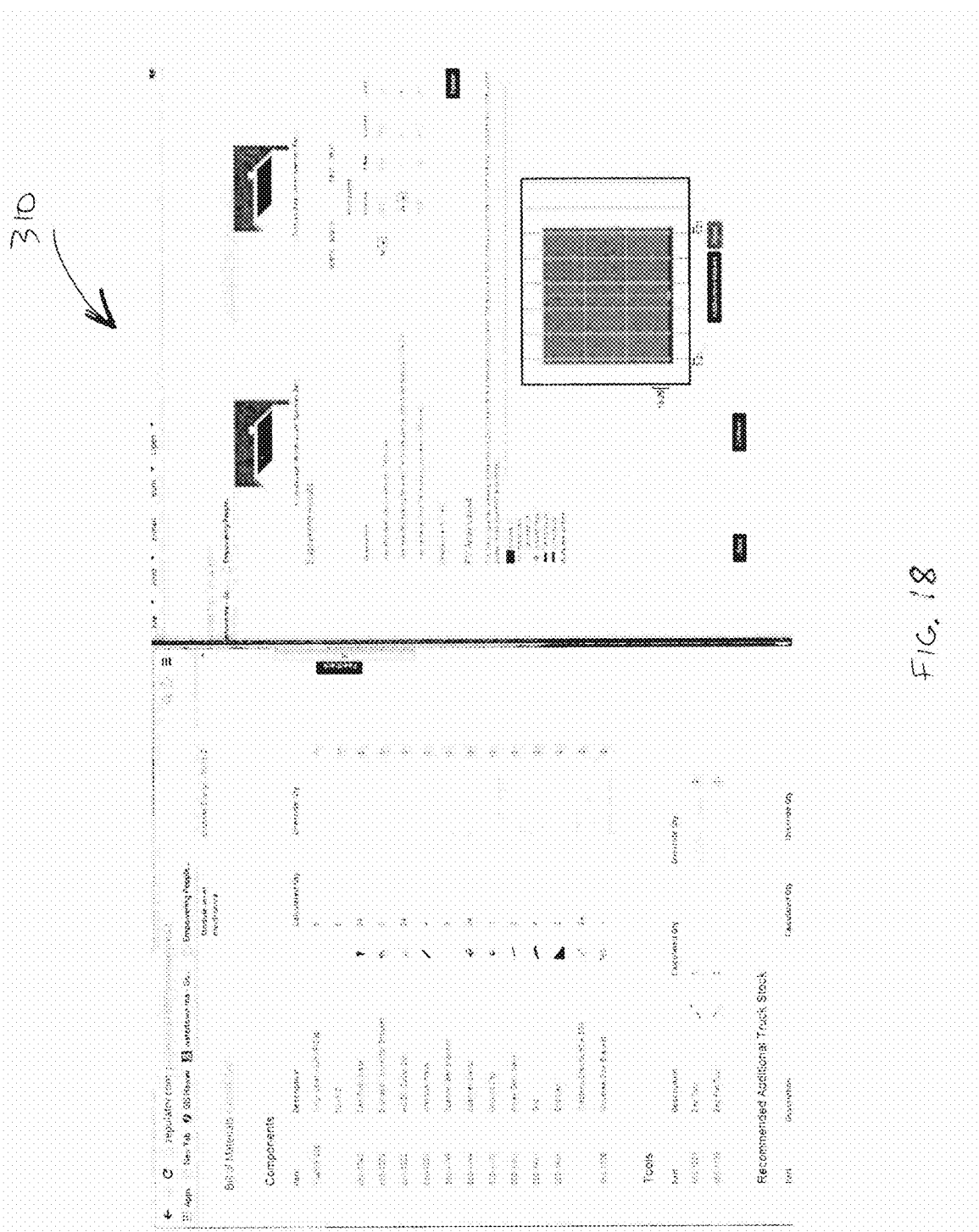
FIG. 18 is a screenshot illustrating an example software tool.

In addition, process 100 may include determining point-loads, mounting foot placement, and bill of materials via the design tool that allows for configuring a system according to site-specific parameters (depicted by numeral 136). For example, a design technician may determine point-loads, mounting foot placement, and bill of materials. A third-party tool may aid in array layouts, determine span and cantilever allowances, and generate bills of materials and more. Further, the third-party tool may generate two reports that are saved to the customer design folder: an engineering report with point-load information, and a bill of materials. By way of example only, an online tool "Zepulator" developed by ZepSolar of San Rafael, Calif. may be used as the third-party tool. In addition, the estimated production report numbers may be validated by, for example only, a CAD Technician. More specifically, a determination may be made as to whether 1) a DC-AC derate factor is substantially 85%; and 2) a number and type of modules on the report matches the number and type of modules on the roof plan. Further, additional correction may be made (e.g., by a design technician), if necessary. As will be appreciated by a person having ordinary skill in the art, a series of losses, combined together, derate an array's performance. These factors (i.e., derate factors), which include voltage drop, shading, and DC-AC conversion loss, among others, may be used to estimate real-world production of the photovoltaic system. FIG. 18 is a screenshot 310 illustrating an example third-party tool.

Figure 19:
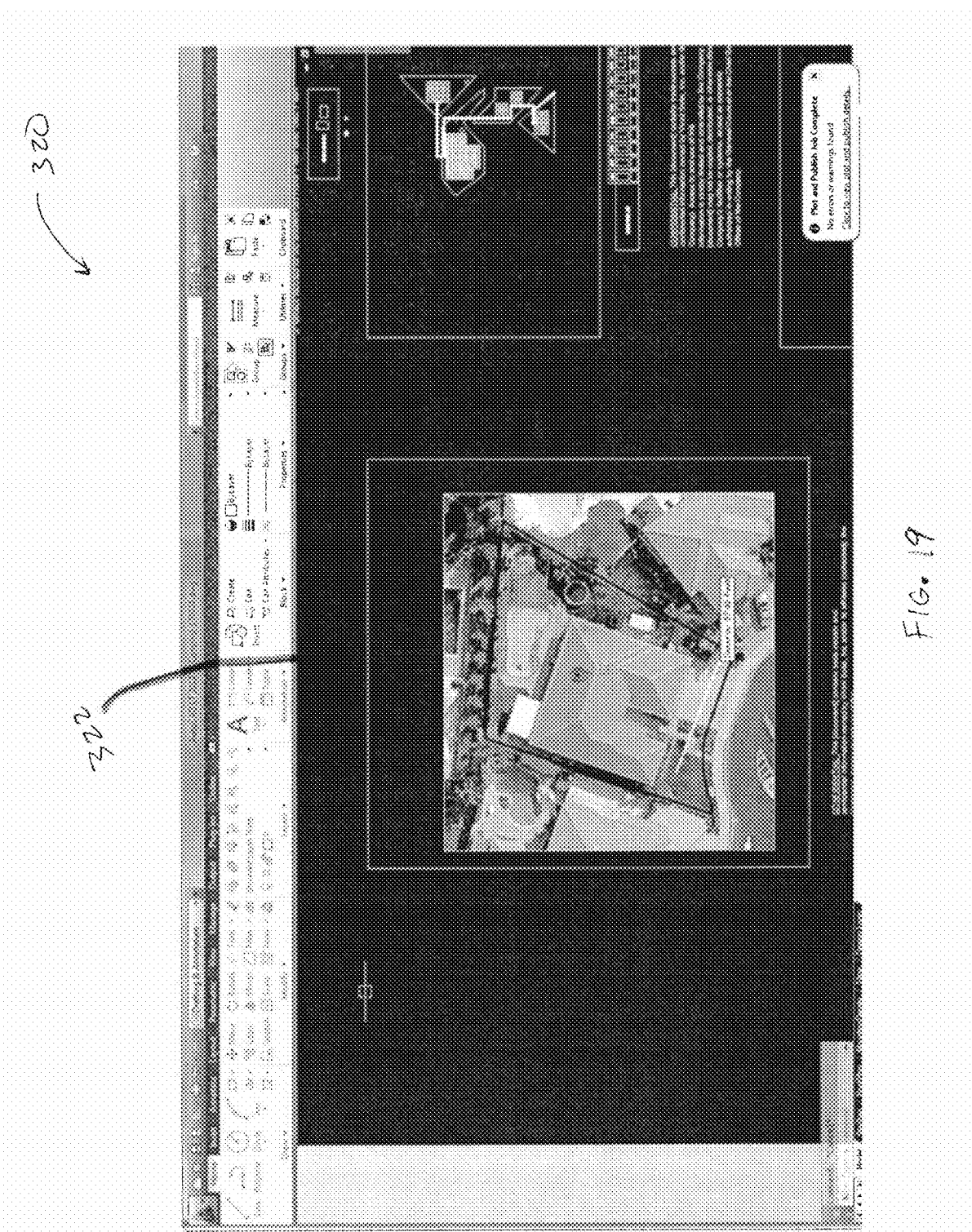
FIG. 19 is a screenshot depicting an example photograph for generating a site plan for a photovoltaic system.

Moreover, process 100 includes creating a site plan of the home, including estimated property lines and required roof offsets, via one or more photographs (e.g., Pictometry photograph) (depicted by numeral 138). As an example, a CAD technician may create a site plan. The site plan may be drawn based on one or more aerial photographs (e.g., Pictometry aerial photograph). It is noted that the drawing may not be to scale and may include the structure, complete photovoltaic array, and approximated property line. FIG. 19 is a screenshot 320 depicting an example photograph 322 that may be used to generate a site plan.

Figure 20:
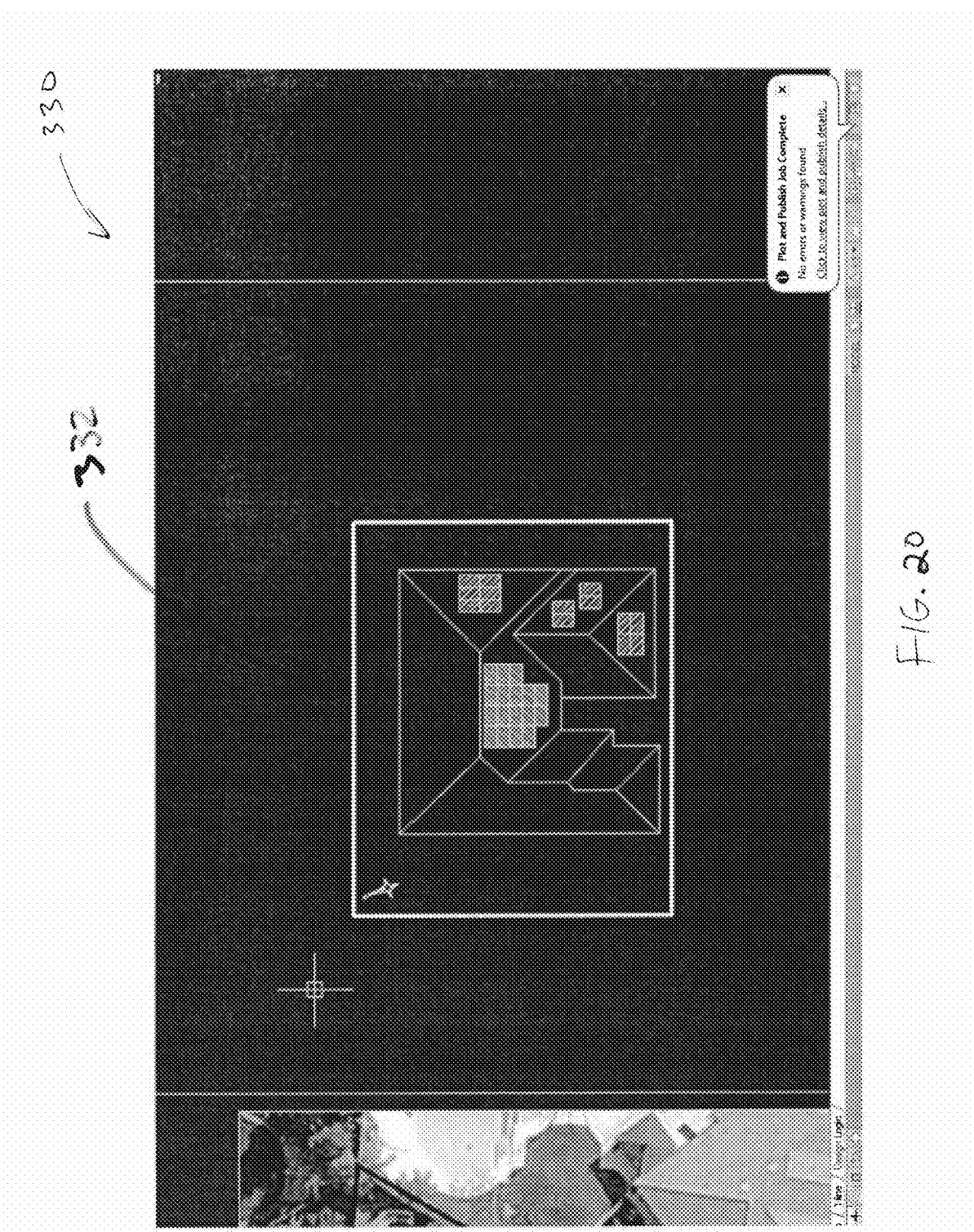
FIG. 20 is a screenshot depicting a site plan including a plurality of modules.
Figure 21:
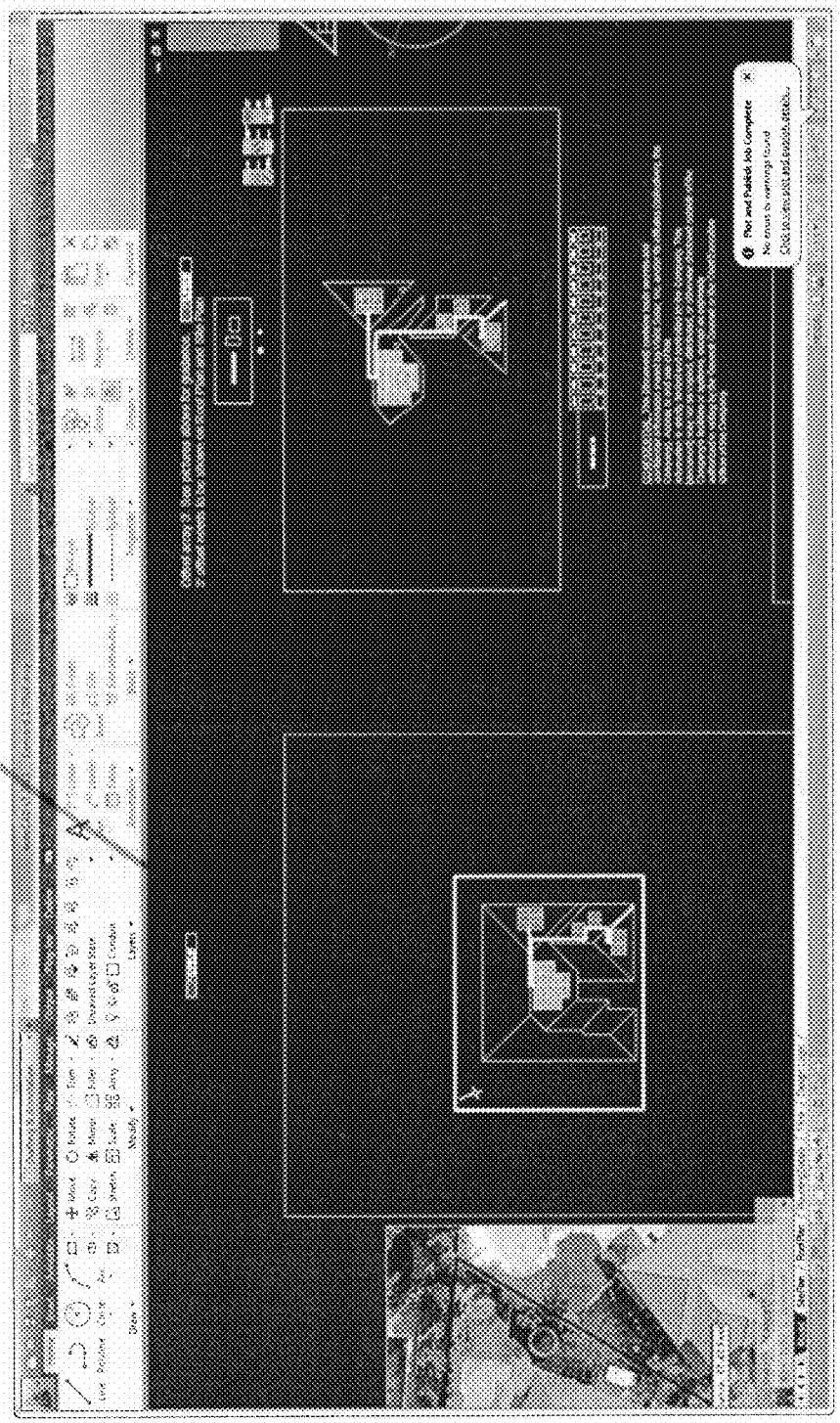
FIG. 21 is a screenshot illustrating a conduit and a plurality of modules on a site.
Figure 22:
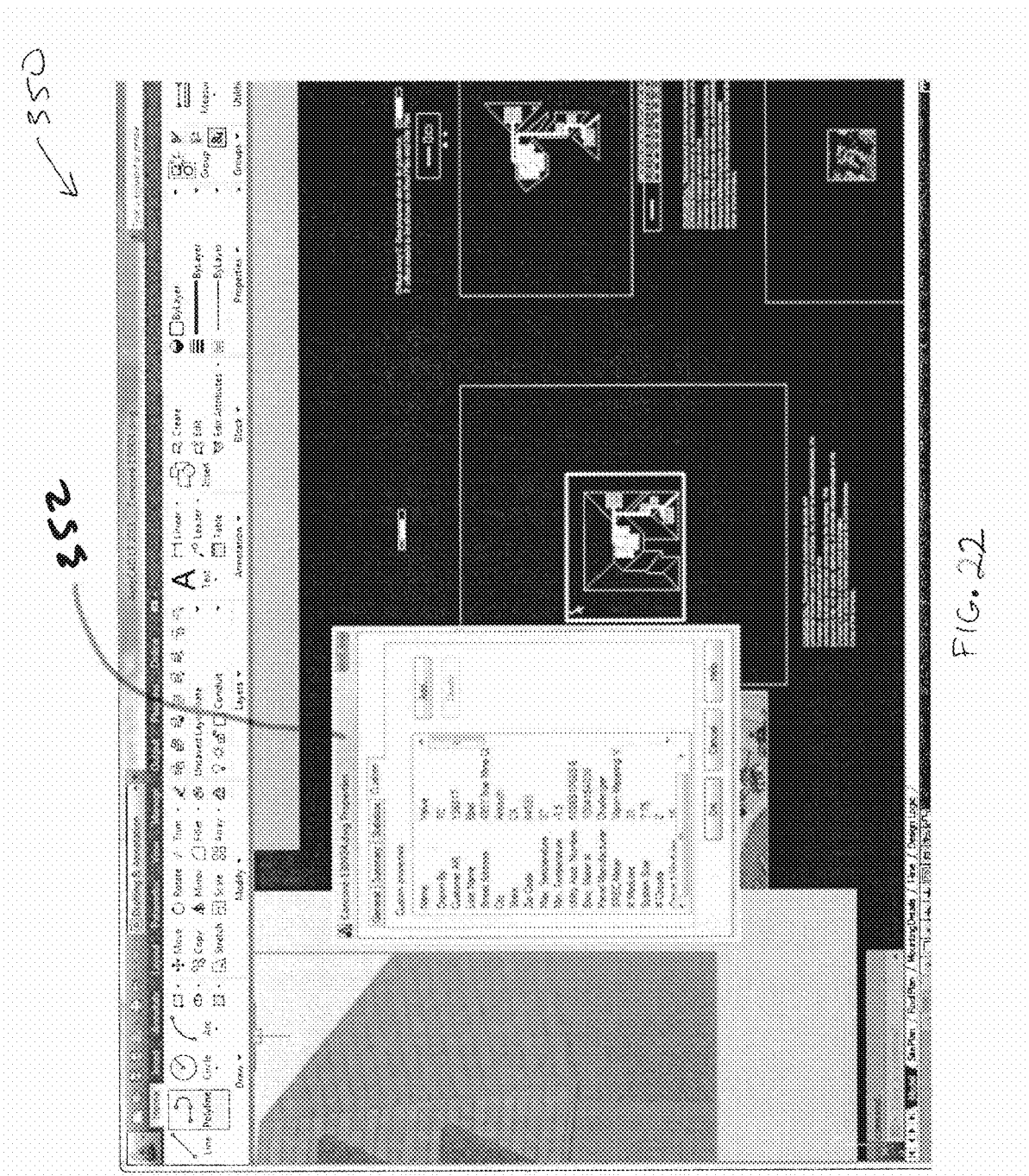
FIG. 22 is a screenshot illustrating a site plan and a drawing properties window.
Figure 23:
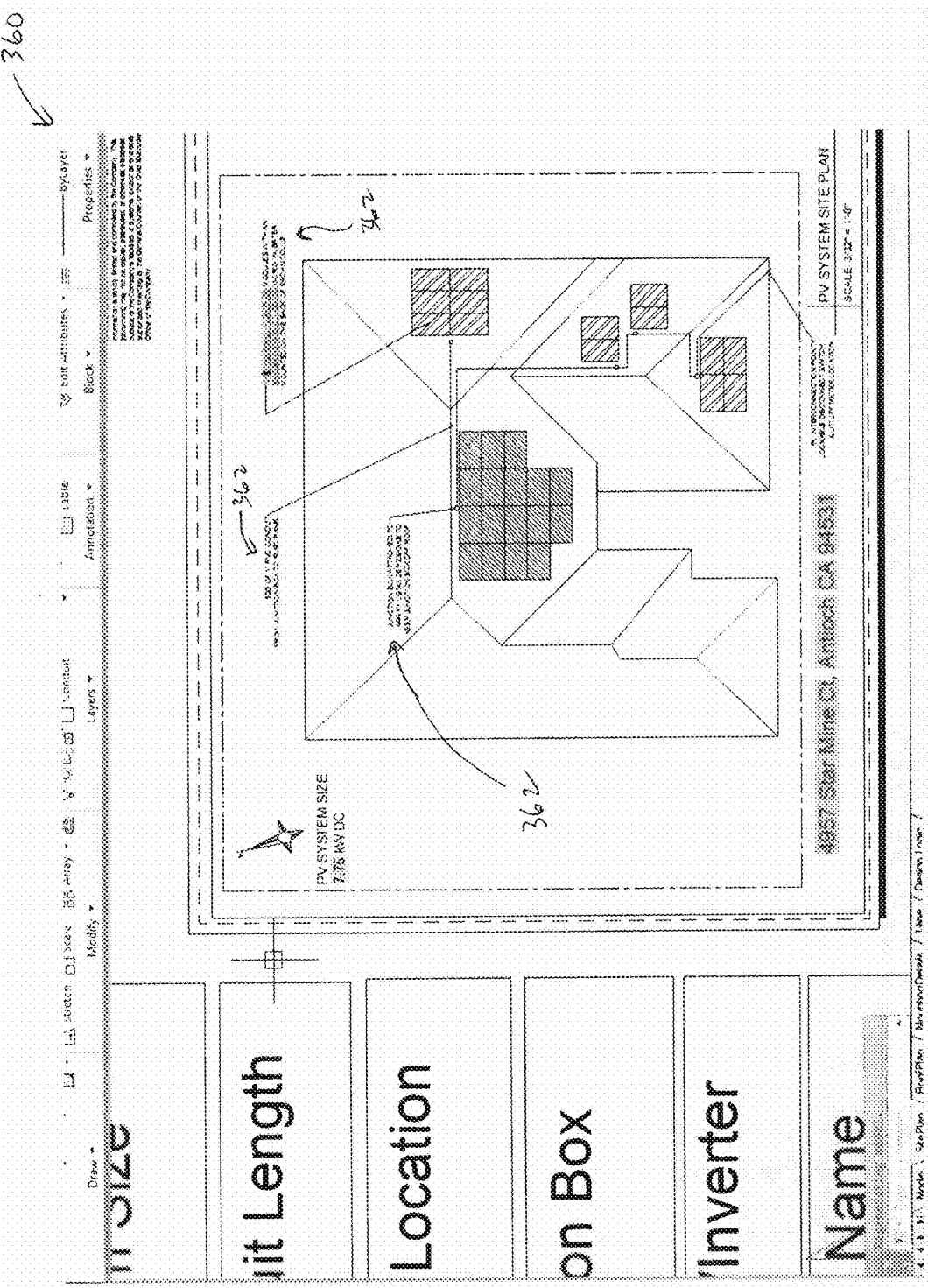
FIG. 23 is a screenshot depicting notes on a site plan.
Figure 24:
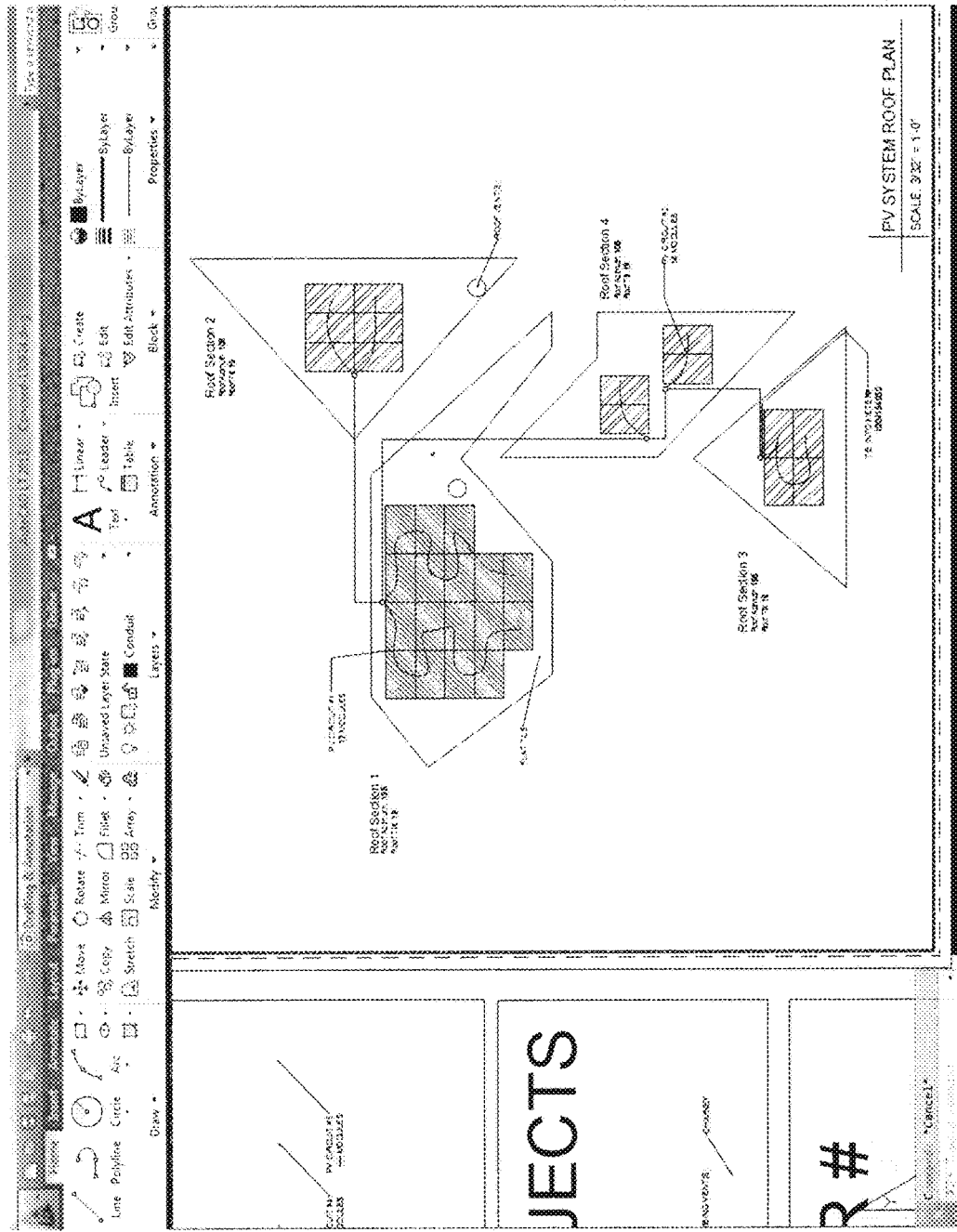
FIG. 24 is a screenshot depicting notes on a roof plan.
Figure 35:
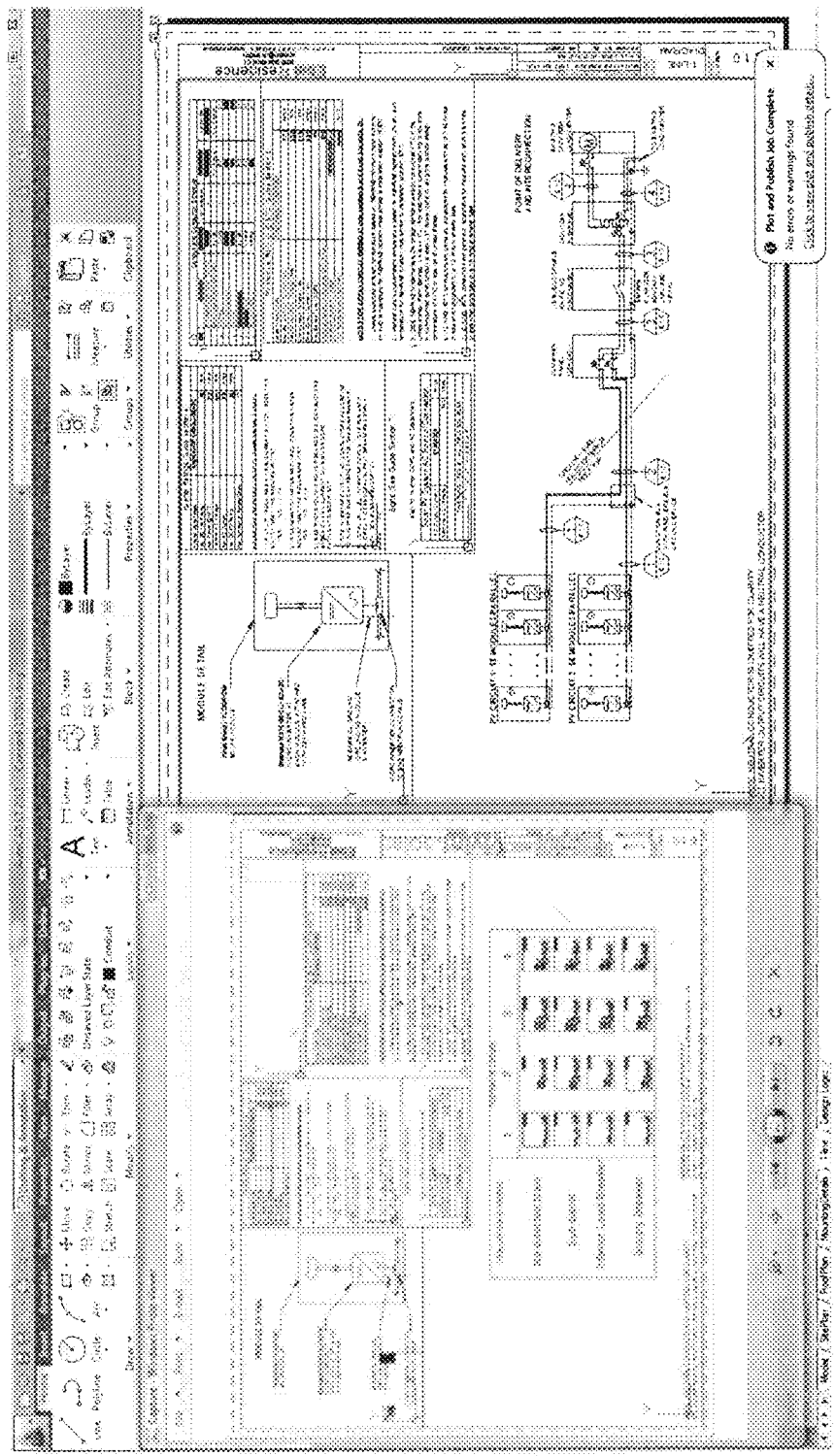
FIG. 35 is a screenshot illustrating a management system for photovoltaic systems.
Figure 26:
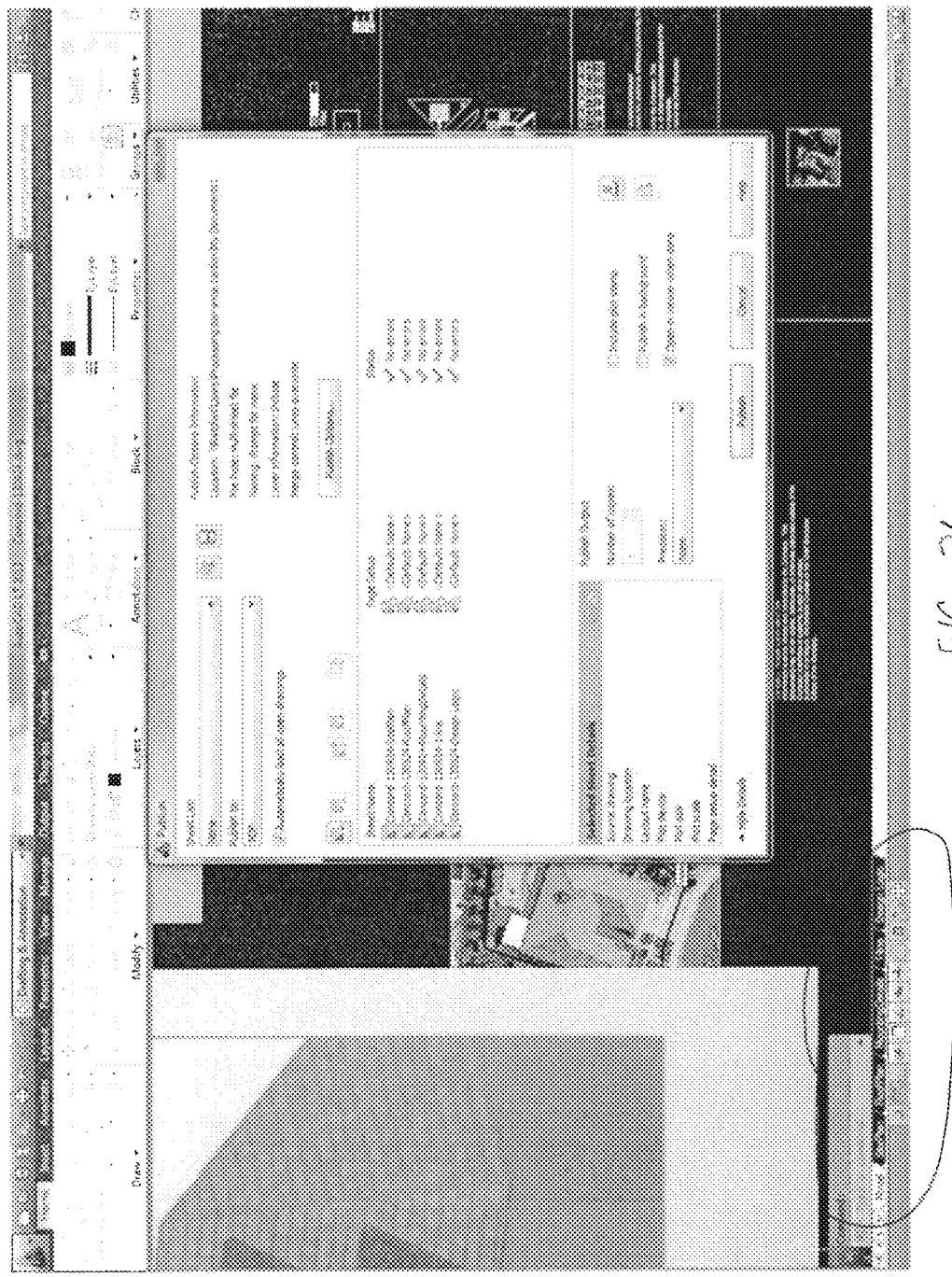
FIG. 26 is a screenshot depicting computer-aided drawings being published.
Figure 27:
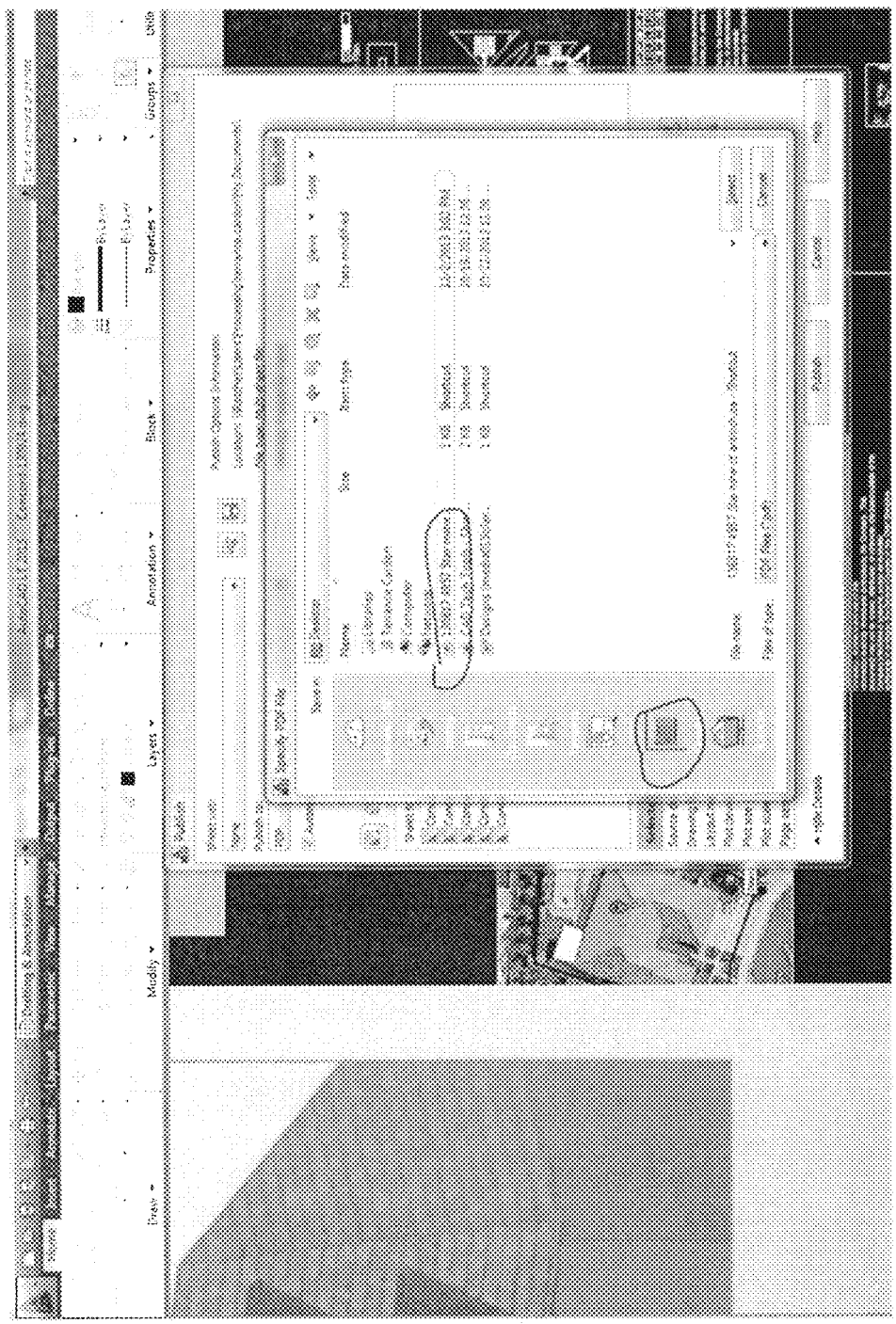
FIG. 27 is another screenshot illustrating computer-aided drawings being published.

Process 100 may also include adding modules to the site plan as designed (depicted by numeral 140). As an example, a CAD technician may add modules to the site plan. FIG. 20 is a screenshot 330 including a site plan 332 including a plurality of modules. Process 100 may also include generating (e.g., drawing) a conduit on the site plan to provide a protected pathway for electrical wiring (depicted by numeral 142). By way of example, a CAD technician may generate a site plan including a conduit. FIG. 21 is a screenshot 340 including a conduit and a plurality of modules on a site plan 342. Further, process 100 may include completing drawing properties with system information (depicted by numeral 144). As an example, a CAD Technician may complete CAD drawing properties with system information. FIG. 22 is a screenshot 350 including a site plan and drawing properties window 352. Moreover, additional notes may be added to and/or associated with the site plan and the roof plan (depicted by numeral 146). FIG. 23 is a screenshot 360 including notes 362 on a site plan. FIG. 24 is a screenshot 370 illustrating notes on a roof plan.

Process 100 may also include selecting a correct electrical one-line diagram (depicted by numeral 148) (e.g., specified by the Pre-Design Technician). As an example, a CAD Technician may select the correct electrical one-line diagram.

Further, process 100 may include publishing CAD drawings to the customer's design folder (depicted by numeral 150). As an example, a CAD technician may publish CAD drawings to the design folder. The CAD drawings may include, but are not limited to, the site plan, the roof plan, mounting details, and an electrical one-line diagram for all designs. CAD drawings may also include a connection layout, a mounting foot spacing diagram, roof detail, module height detail, and placard. FIG. 25 is a screenshot 380 depicting a one-line diagram in a CAD tool, and FIGS. 26 and 27 respectively include screenshots 390 and 395, each illustrating CAD drawings being published.

Process 100 may also include completing a NREL PVWatts process (depicted by numeral 152). As an example, a CAD technician may complete the NREL PVWatts process. NREL PVWatts is an online tool provided by the National Renewable Energy Laboratory (NREL) of the U.S. Department of Energy. The PVWatts tool includes an interactive map-based interface to rapidly utilize a PVWatts calculator, which is a basic solar modeling tool that calculates hourly or monthly photovoltaic energy production based on minimal inputs. Currently, a NREL PVWatts process may only be required in certain geographic locations (e.g., New Jersey and Maryland). Currently, New Jersey requires an "ideal" estimate and an "actual" estimate, while Maryland requires only an "actual" estimate. An ideal estimate is calculated for each roof section array based off of the array's actual system size and using PVWatts' pre-defined "ideal" conditions. An actual estimate is calculated for each roof section array based off of the array's actual system size, tilt, and azimuth, factoring in an estimated DC-AC derate factor calculated with the design tool.

Figure 28:
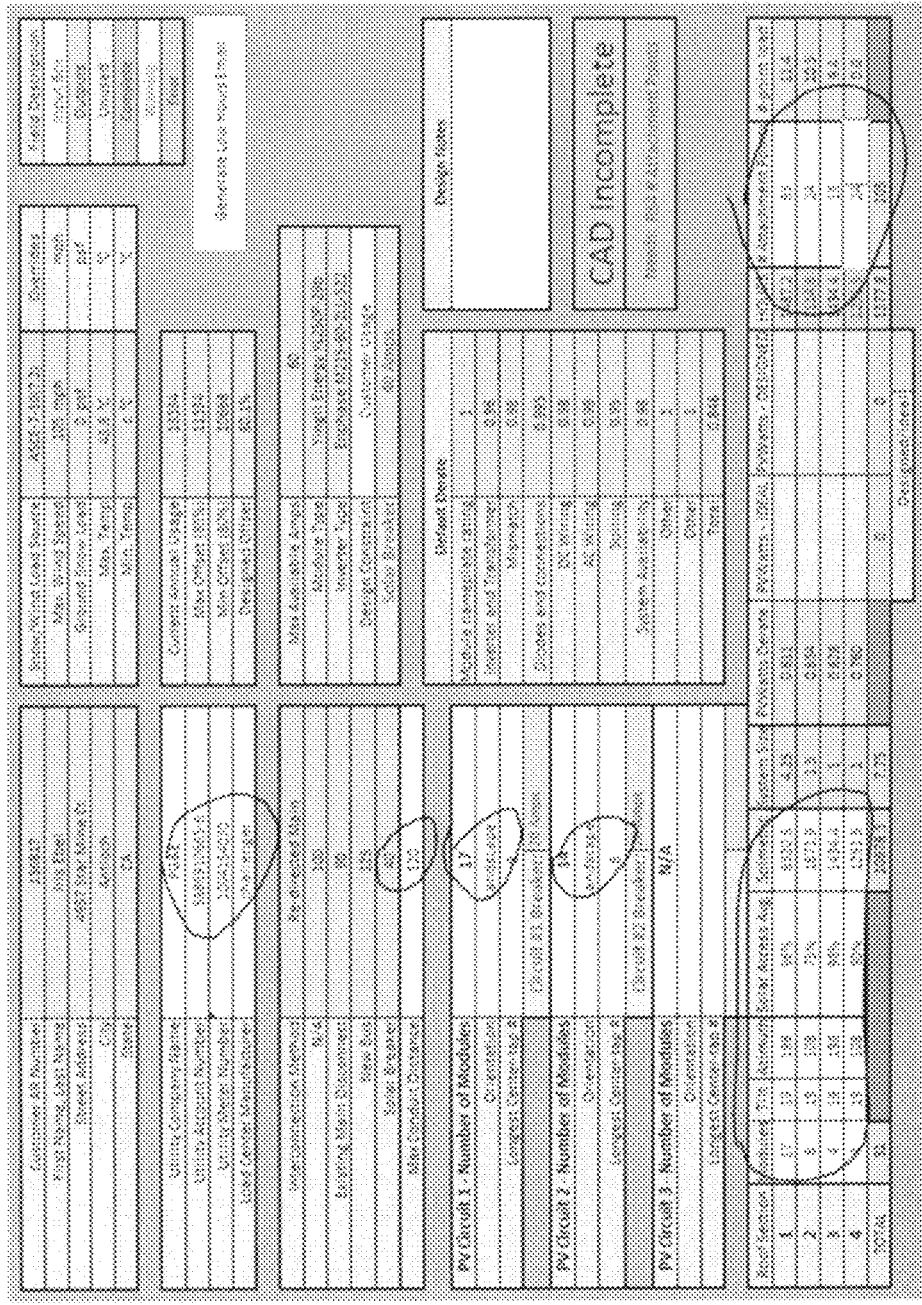
FIG. 28 is a screenshot depicting a software design tool.
Figure 29:
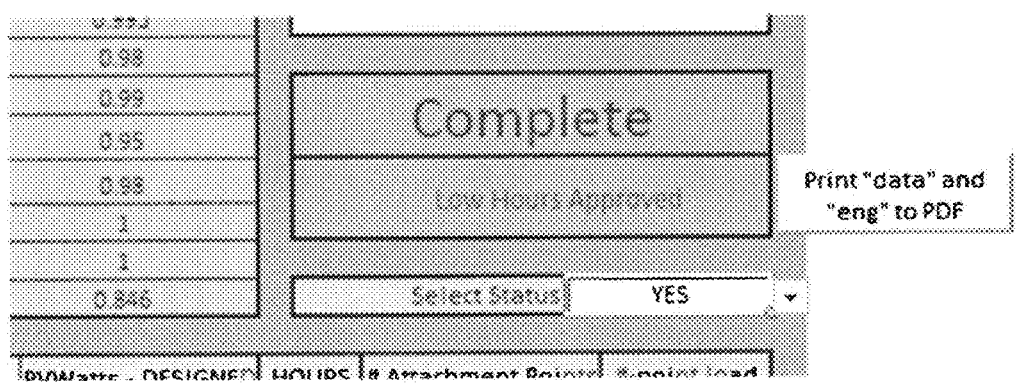
FIG. 29 is another screenshot depicting the software design tool illustrated in FIG. 28.

Additionally, process 100 can include populating the design tool with system information (depicted by numeral 154). The design tool may be populated by, for example, a CAD technician. FIG. 28 is a screenshot 400 depicting the design tool. FIG. 29 is another screenshot 410 depicting the design tool.

Process 100 may also include generating engineering and data pages from the design tool (e.g., printing as PDF files) (depicted by numeral 156). The engineering and data pages may be generated by a CAD technician, for example. Data pages may contain calculated data for derate factors, electrical and point-load information, and installation materials and costs estimates.

Figure 30:
FIG. 30 is a screenshot depicting engineering documents being merged into an engineering packet for a photovoltaic system.

Process 100 may further include merging engineering documents from the design tool and the engineering files (e.g., engineering files develop via Zepulator) into an engineering packet to save in the customer design folder (depicted by numeral 158). A CAD technician, for example, may merge the engineering document and the engineering files into an engineering packet. FIG. 30 is a screenshot 420 depicting engineering documents being merged into an engineering packet.

Figure 31:
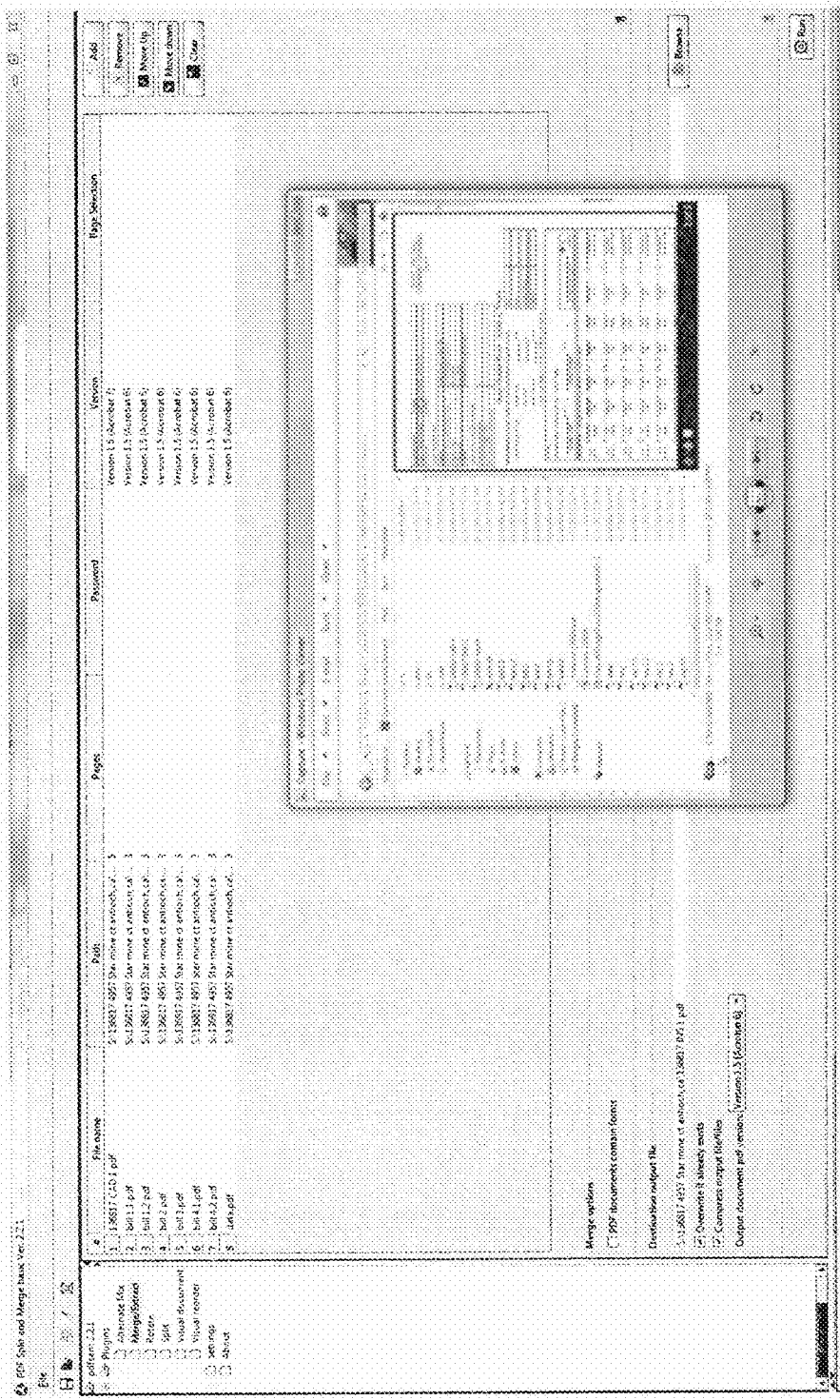
FIG. 31 is a screenshot illustrating various documents being merged into an installer packet for a photovoltaic system.

Furthermore, process 100 may include merging the published CAD, the bill of materials, and the data document from the design tool into an installer packet, which may be saved in the customer design folder (depicted by numeral 160). For example, a CAD technician may merge the published CAD, the bill of materials, and the data document from the design tool into an installer packet. FIG. 31 is a screenshot 430 illustrating various documents being merged into an installer packet.

Figure 32:
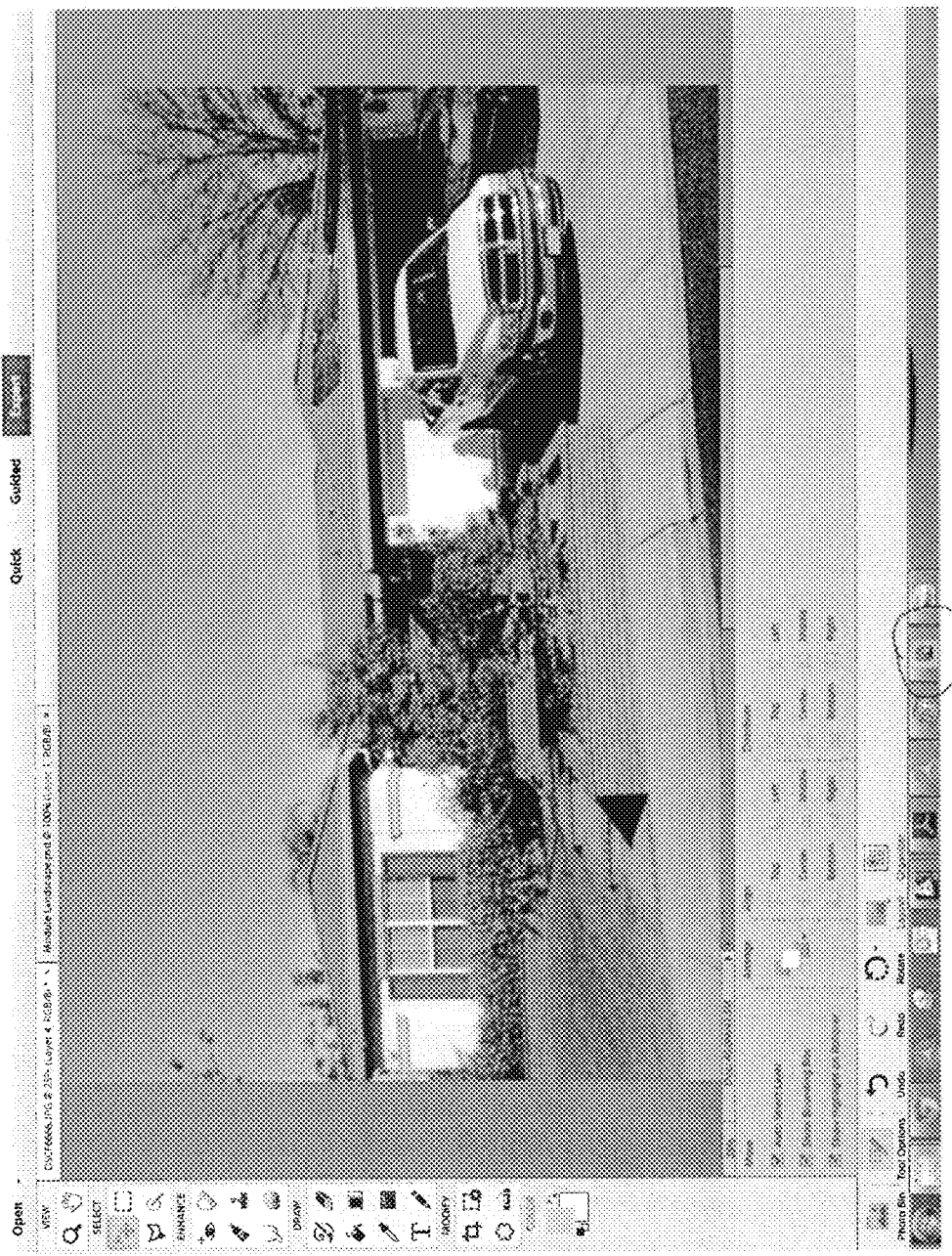
FIG. 32 is a screenshot including a photograph including a module.

In addition, process 100 may include creating an approximate look for the modules on the structure in an image (depicted by reference numeral 162). It is noted that act 162 may require a photograph of sufficient quality. Further, as an example, a software application (e.g., Adobe Photoshop Elements) may be used (e.g., by a CAD technician) to create an image illustrating the approximate look for the modules on the structure. This may be created to give the customer an idea of what the modules will look like on the structure (e.g., their house). The "front of the house" photograph (e.g., taken by a site surveyor) is typically used, unless there is a more appropriate photograph. In this example, the CAD technician, for example, simply places modules as they would be visible on the photograph, according to the site plan and roof plan. FIG. 32 is a screenshot 440 including an image with a module on a structure.

Figure 33:
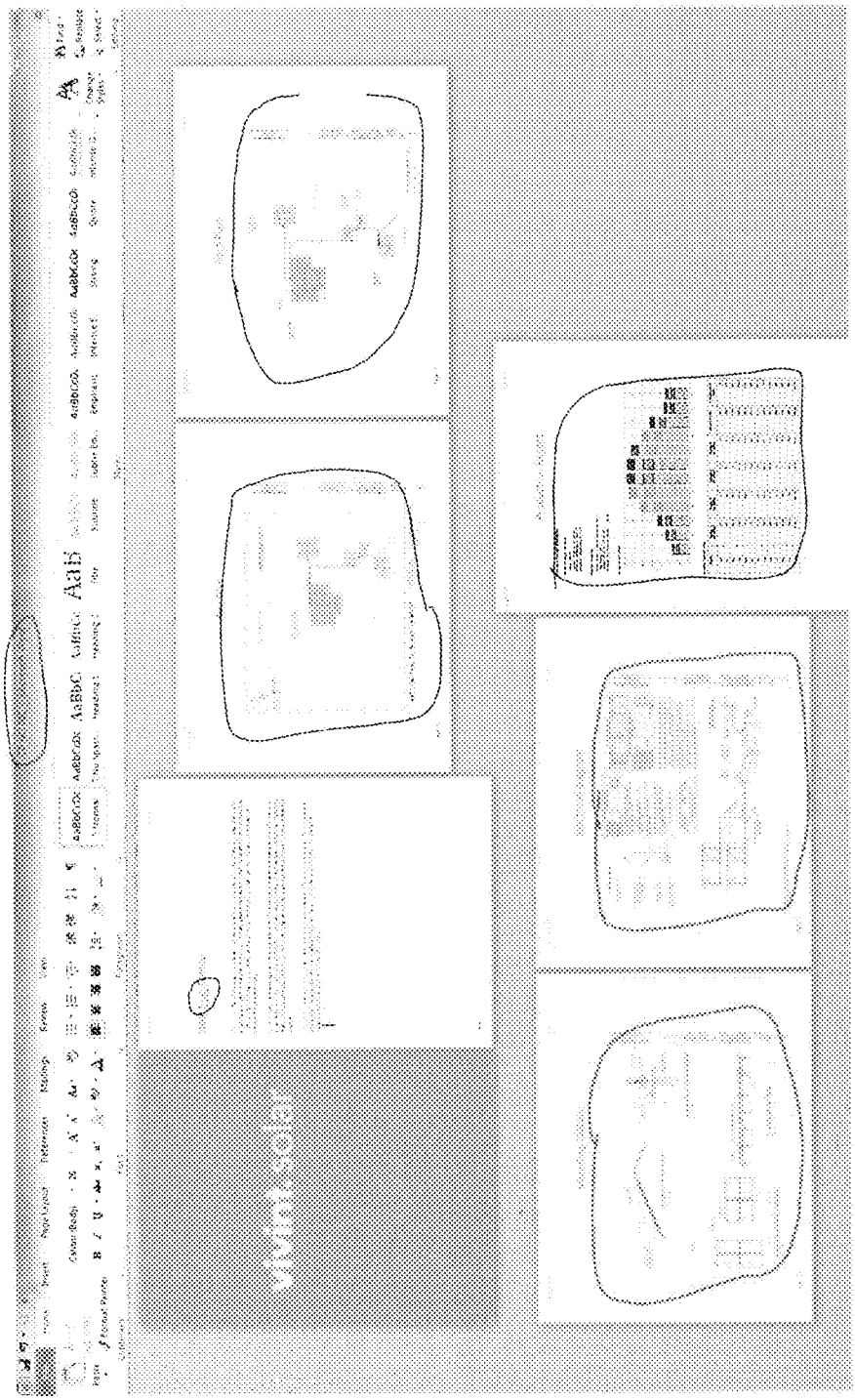
FIG. 33 is a screenshot depicting a customer packet for a photovoltaic system.

Process 100 may also include compiling the customer packet and saving it to the customer's design folder (depicted by reference numeral 164). A CAD technician, for example, may compile and save the customer packet. The customer packet may be sent to the customer to show them the proposed design for their photovoltaic system. This packet may include a cover page, a welcome letter to the customer and their family, a Photoshop image of the customer's home (if available), each of the pages in the published CAD, and/or the estimated production report. FIG. 33 is a screenshot 450 including various documents of a customer packet.

Figure 34:
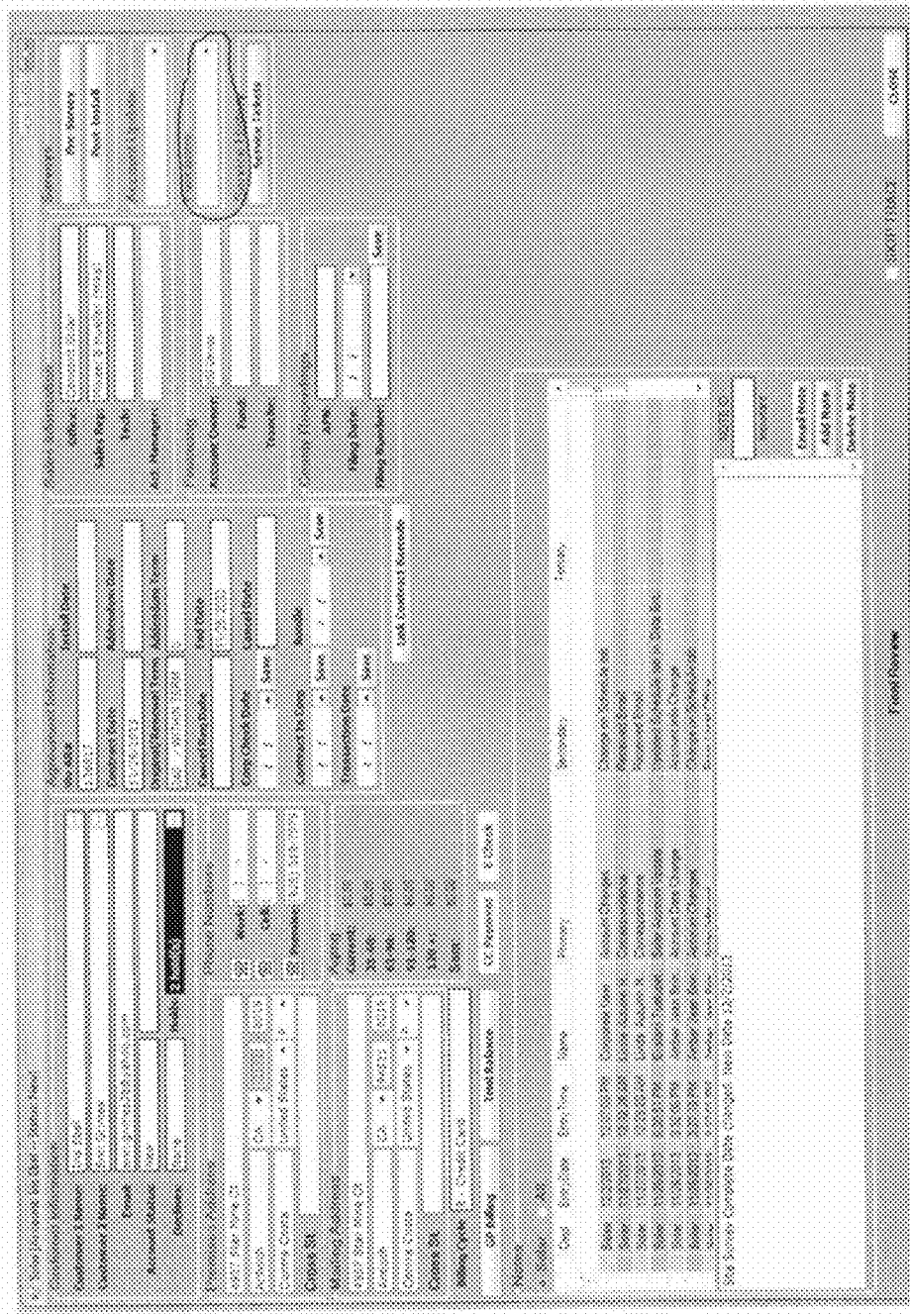
FIG. 34 is a screenshot depicting a customer design folder for a photovoltaic system.
Figure 35:
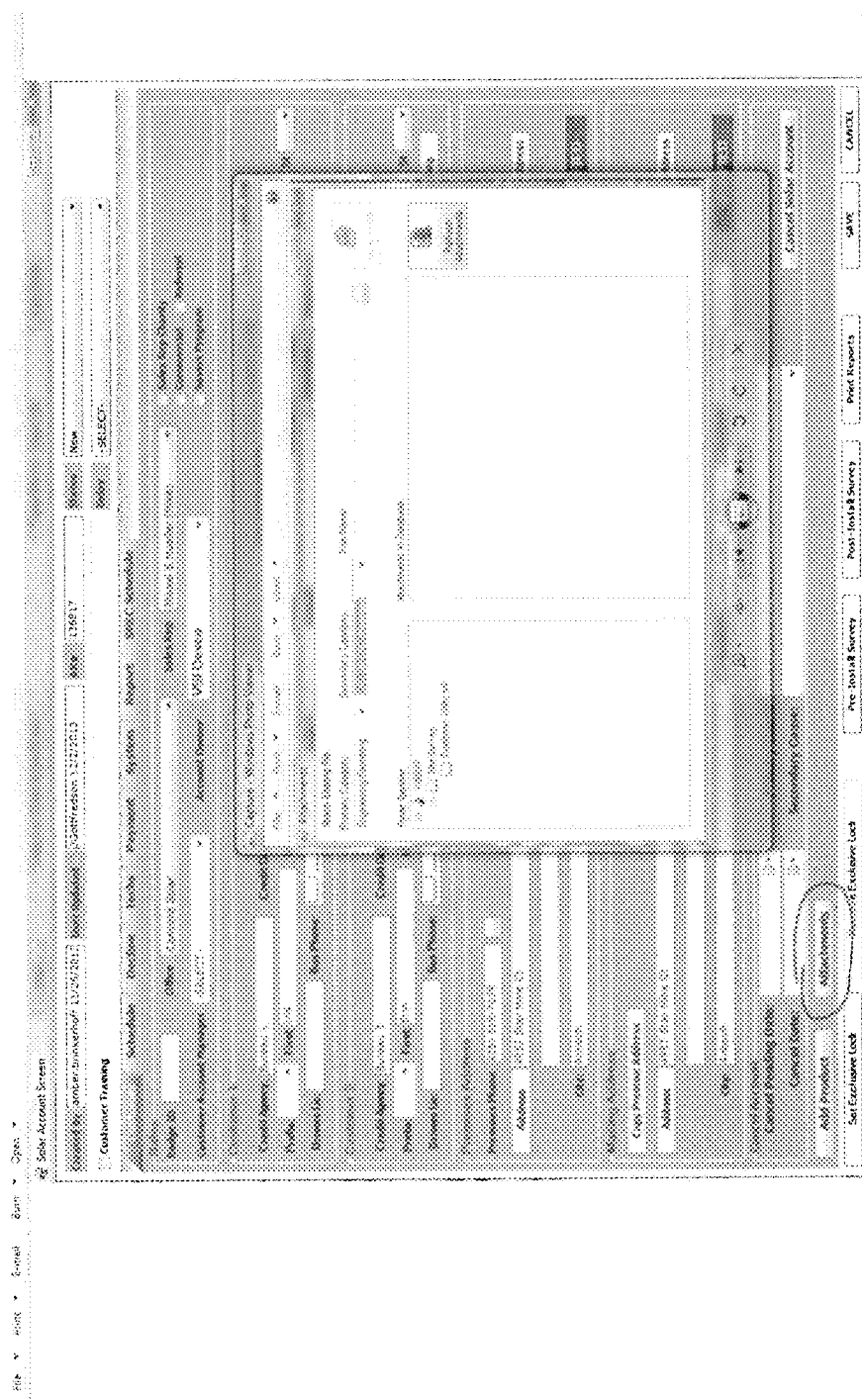
Figure 36:
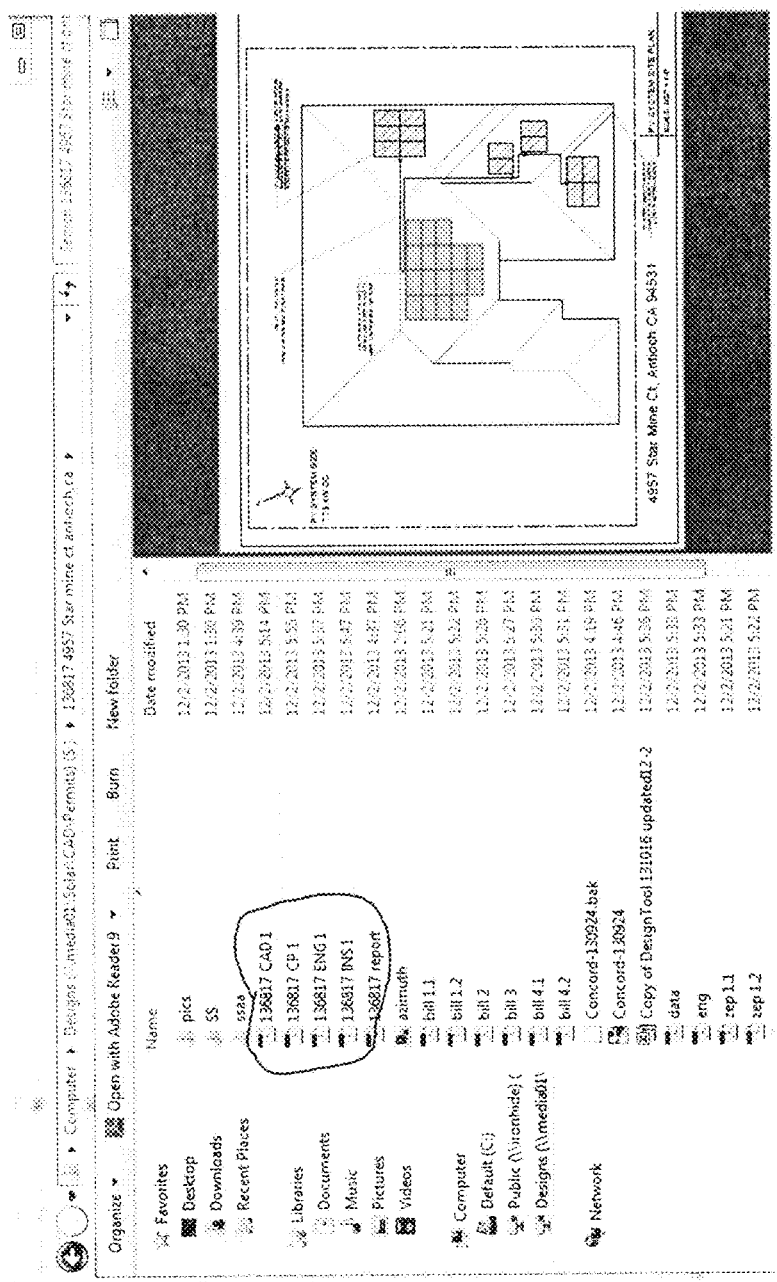
FIG. 36 is a screenshot depicting files from a customer design folder.

Process 100 can further include uploading all relevant files from the customer's design folder into a management system (depicted by act 166). For example, a CAD technician may upload the relevant files. A management system may be configured as a solution for storing and tracking customer personal and account-specific information. Files uploaded to the management system may include published CAD drawings, a placard (where required), an installer packet, an engineering packet, an estimated production report, a customer packet, a site survey form, and/or site survey photographs. Other files may be uploaded as required. FIG. 34 includes a screenshot 460 depicting a customer design folder, FIG. 35 includes a screenshot 470 illustrating a management system, and FIG. 36 includes a screenshot 480 depicting files from a customer design folder.

Figure 37:
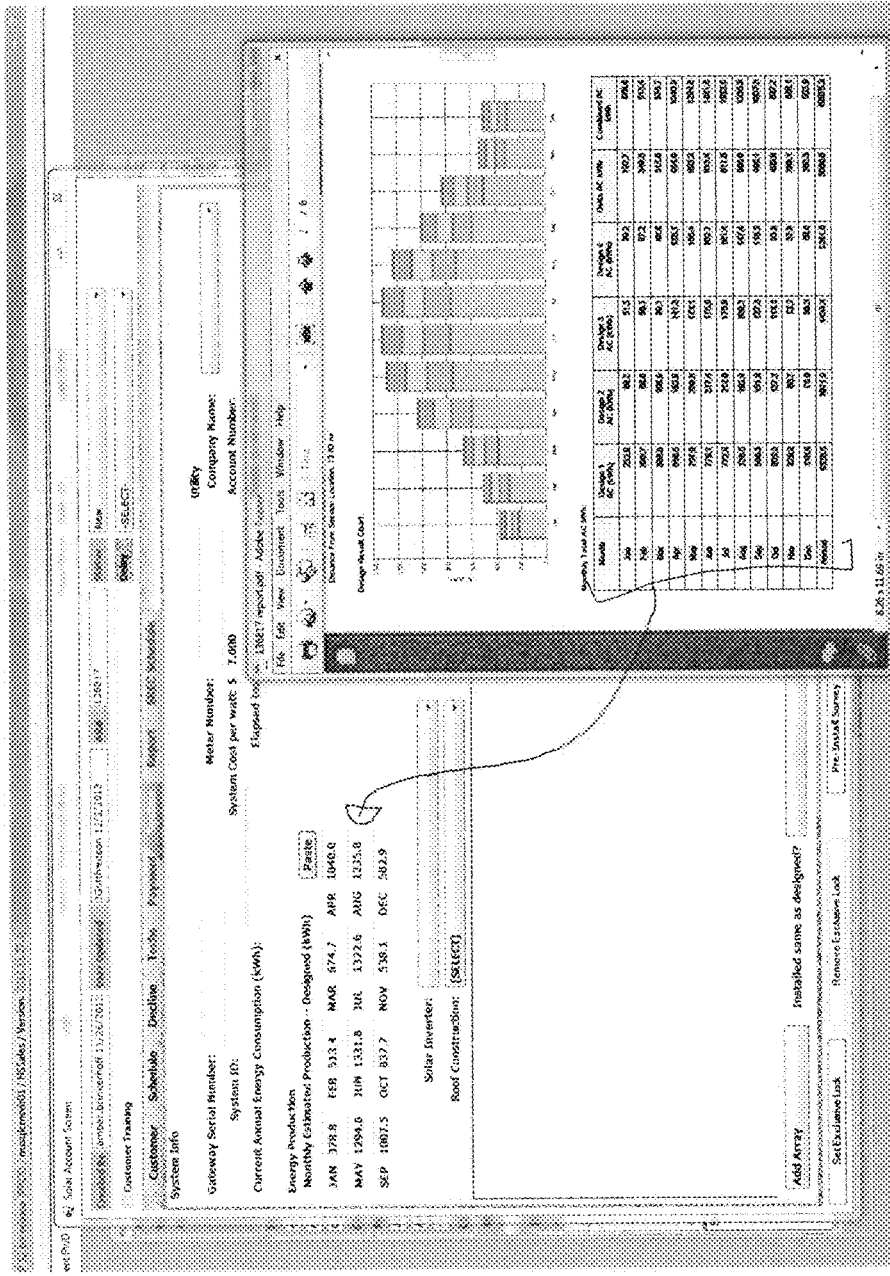
FIG. 37 is another screenshot illustrating a management system.
Figure 38:
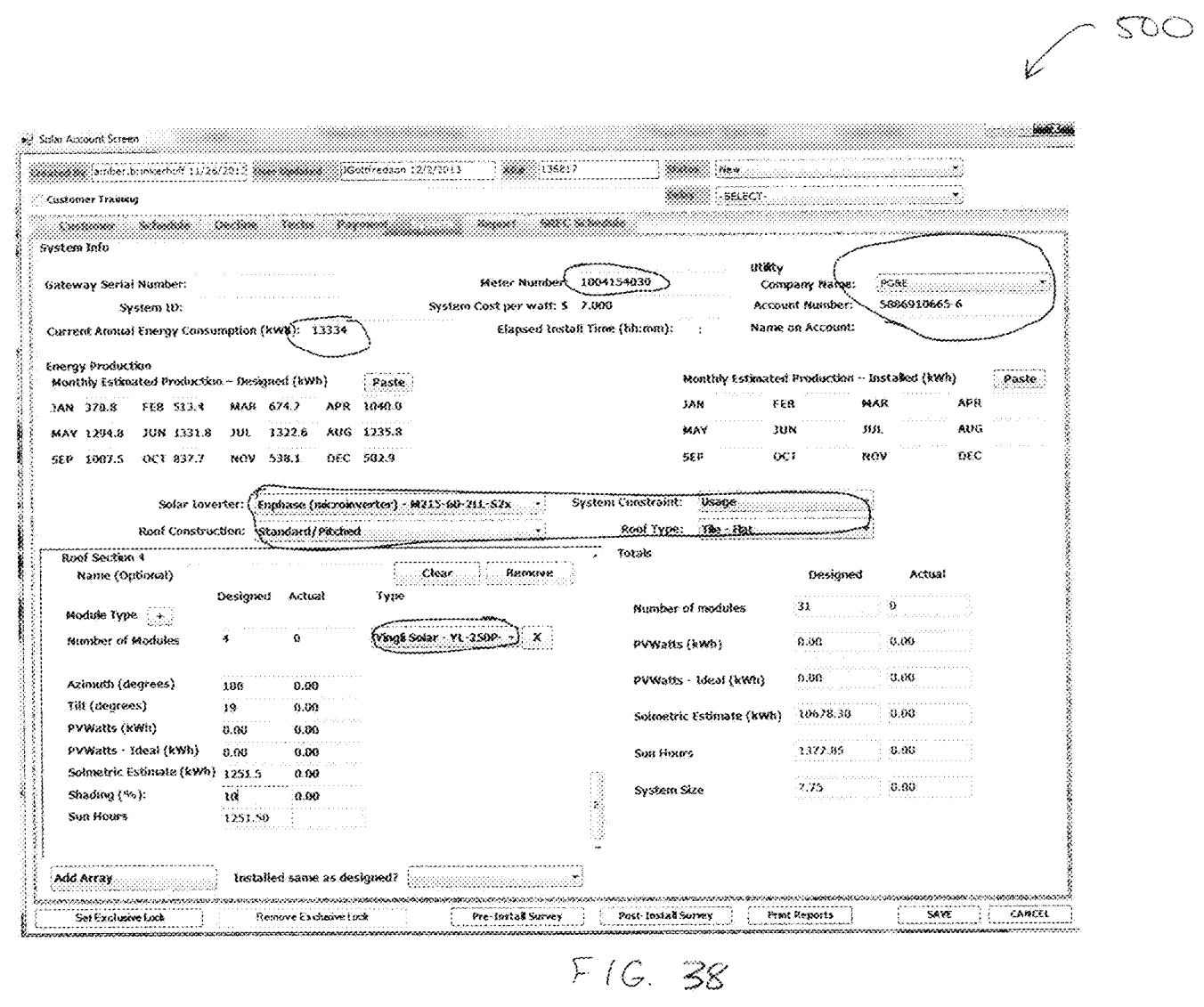

Process 100 may also include populating the management system with system information (depicted by act 168). The management system may be populated by, for example, a CAD technician. FIGS. 37 and 38 respectively include screenshots 490 and 500, each depicting the management system.

In addition, process 100 may include verifying accuracy of all files (depicted by act 170). As an example, a post-install technician may verify the accuracy of files. Any noted error may be handled by appropriate personnel. For example, a design technician may handle design errors and a CAD technician may handle CAD errors. Errors may be corrected and re-submitted to, for example, a post-install technician.

Further, process 100 can include sending a customer packet to a customer for review and approval (depicted by act 172). If not approved, a representative may work with the customer for redesign. If approved, a permitting process may be initiated.

Process 100 may further include completing a structural review (depicted by act 174). By way of example, a structural engineer may review the roof's structural integrity for photovoltaic installation.

Process 100 may also include installing the photovoltaic system (depicted by act 176) and checking actual installation photographs (i.e., photographs taken by installers at the time of installation) and installation work order against original, published CAD files (depicted by act 178). Process 100 may also include adjusting a report and CAD files to reflect actual installation (depicted by act 180). For example, a post-install technician may adjust the report and CAD files.

Further, system information of the management system may be updated and the as-built files (e.g., site plan, roof plan, mounting details, electrical one-line diagram for all designs) may be uploaded (depicted by act 182). As an example, a post-install technician may update the system information and update the as-built files.

In addition, process 100 may include performing a post-installation structural review (depicted by act 184). The review may be used to verify that the installation followed the structural review requirements.

Figure 39:
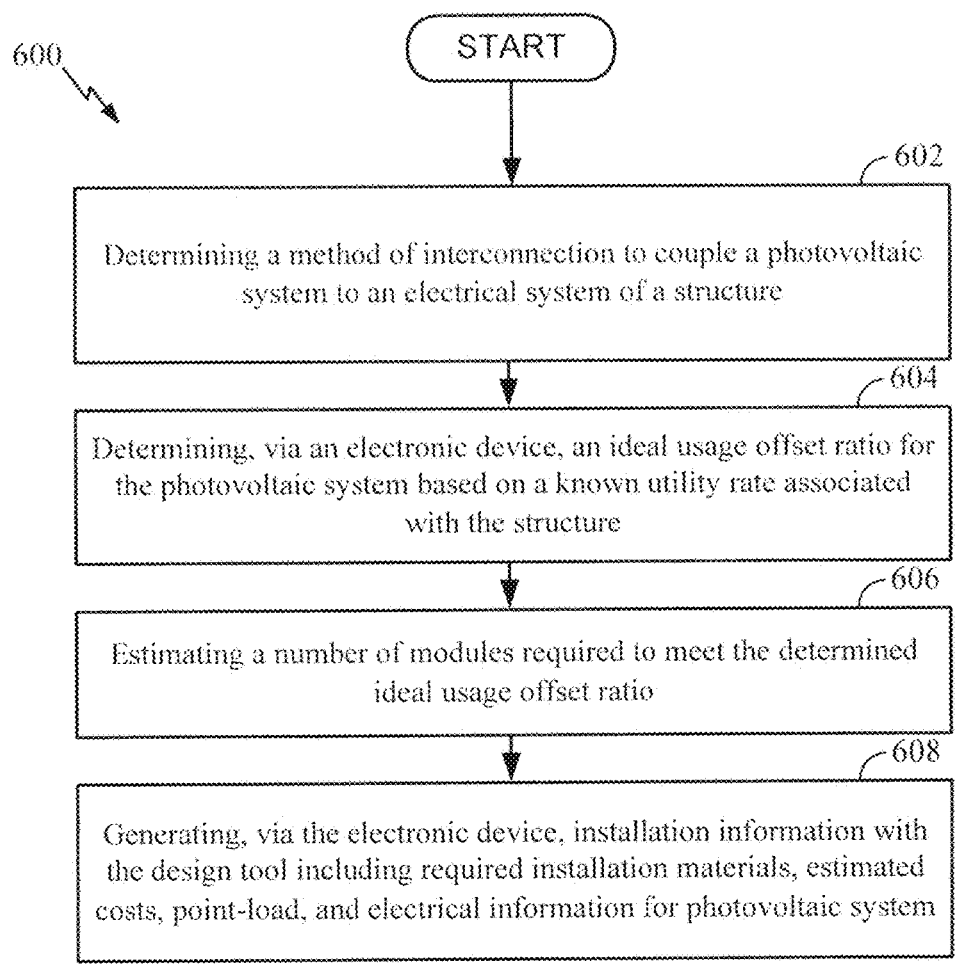
FIG. 39 is a flowchart of a method, according to an embodiment of the present disclosure.

FIG. 39 is a flowchart of a method 600, according to an embodiment of the present invention. Method 600 includes determining a method of interconnection to couple a photovoltaic system to an electrical system of a structure (act 602). Method 600 further includes determining, via an electronic device, an ideal usage offset ratio for the photovoltaic system based on a known utility rate associated with the structure (act 604). In addition, method 600 includes estimating a number of modules required to meet the determined ideal usage offset ratio (act 606). Moreover, method 600 includes generating, via the electronic device, installation information with the design tool including required installation materials, estimated costs, point-load, and electrical information for photovoltaic system (act 608).

Although the foregoing description contains many specifics, these should not be construed as limiting the scope of the invention or of any of the appended claims, but merely as providing information pertinent to some specific embodiments that may fall within the scopes of the invention and the appended claims. Features from different embodiments may be employed in combination. In addition, other embodiments of the invention may also be devised which lie within the scopes of the invention and the appended claims. The scope of the invention is, therefore, indicated and limited only by the appended claims and their legal equivalents. All additions, deletions and modifications to the invention, as disclosed herein, that fall within the meaning and scopes of the claims are to be embraced by the claims.

What is claimed:

1. A method, comprising:
performing a site survey at a location including a structure to generate site survey information including customer information, electrical information for the structure, illustrations of a roof of the structure, measurements of the roof, roof obstruction information, tilt information for the roof, photos of the structure, photos of the sky from one or locations on the roof, a utility bill for the structure, and structure utility usage information;
determining a method of interconnection to couple a photovoltaic system to an electrical system of the structure based on at least one photo from the site survey information;
determining, via an electronic device, an ideal usage offset ratio for the photovoltaic system based on at least some of the site survey information;
estimating, via the electronic device, a number of modules required to meet the determined ideal usage offset ratio;
generating a roof plan based on at least a portion of the site survey information, the roof plan including an illustration of each roof section of the roof, each roof section illustration depicting one or more modules of the number of modules and at least one of a trunk cable, hatching, and a conduit;
comparing estimated production levels for the photovoltaic system including the number of modules at the location to required production levels;
one of approving and rejecting the photovoltaic system based on the comparison of the estimated production levels and the required production levels;
generating, via the electronic device, installation information including the determined method of interconnection, the ideal usage offset ratio, the number of modules required to meet the determined ideal usage offset ratio, the roof plan, required installation materials, estimated costs, point-load, an estimated production report, and electrical information for the photovoltaic system; and
providing the installation information to a customer for approval.

2. The method of claim 1, further comprising providing an application program of the electronic device with information related to the photovoltaic system including the estimated number of modules.

3. The method of claim 2, wherein providing an application program with information comprises providing at least one of customer account information, location-specific information, and electrical codes to the application program.

4. The method of claim 2, wherein determining an ideal usage offset ratio for the photovoltaic system comprises determining the ideal usage offset ratio for the photovoltaic system with the application program.

5. The method of claim 2, wherein estimating a number of modules comprises estimating a number of modules with the application program.

6. The method of claim 1, wherein generating installation information comprises generating a data document including information related to the required installation materials and estimated costs and an engineering document including point-load information and electrical information.

7. The method of claim 1, wherein determining an ideal usage offset ratio comprises determining the ideal usage offset ratio for the photovoltaic system based on a known utility rate and one or more utility discounts associated with the structure.

8. The method of claim 1, wherein performing the site survey further comprises generating the site survey information including attic information for the structure.

9. The method of claim 1, further comprising:
obtaining an aerial photo of the structure;
calculating an azimuth of a roof of the structure from the aerial photo; and
scaling the aerial photo into a computer-aided design (CAD) file.

10. The method of claim 9, wherein generating a roof plan comprises illustrating one or more roof sections on the CAD file in order of approximated production efficiency in the roof plan based on roof measurements and tilt information.

11. The method of claim 10, further comprising applying required offsets to each roof section illustration of the CAD file.

12. The method of claim 10, further comprising adding at least one module to the CAD file to at least one of fill each roof section and meet the number of modules required for the determined ideal usage offset ratio.

13. The method of claim 10, further comprising calculating estimated production levels for each module, each roof section, and the photovoltaic system.

14. The method of claim 10, further comprising:
calculating sun hours for each roof section; and
comparing the calculated sun hours with required sun hour levels.

15. The method of claim 10, further comprising adding trunk cable, hatching, and conduit to each roof section of the CAD file.

16. The method of claim 1, further comprising determining one or more constraints for the photovoltaic system.

17. The method of claim 1, further comprising determining point-loads, mounting foot placement, and bill of materials for the photovoltaic system.

18. The method of claim 1, further comprising creating a site plan of the structure including estimated property lines and required roof offsets based on an aerial photo.

19. The method of claim 18, further comprising adding the estimated number of modules and a conduit to the site plan.

20. The method of claim 1, further comprising installing the photovoltaic system.

21. A system, comprising:
an electronic device including a processor;
a computer-readable medium coupled to the processor; and
an application program stored in the computer-readable medium, wherein the application program, when executed by the processor, is configured to:
receive site survey information from a site survey performed at location including a structure, the site survey information including customer information, electrical information for the structure, illustrations of a roof of the structure, measurements of the roof, roof obstruction information, tilt information for the roof, photos of the structure, photos of the sky from one or locations on the roof, a utility bill for the structure, and structure utility usage information;
determine an ideal usage offset ratio for a photovoltaic system based on one or more parameters associated with the structure determined via at least some of the site survey information;
estimate a number of modules required to meet the determined ideal usage offset ratio;
generate a roof plan based on at least a portion of the site survey information, the roof plan including an illustration of each roof section of the roof, each roof section illustration depicting one or more modules of the number of modules and at least one of a trunk cable, hatching, and a conduit;
compare estimated production levels for the photovoltaic system including the number of modules at the location to required production levels;
one of approve and reject the photovoltaic system based on the comparison of the estimated production levels and the required production levels; and
generate installation information for the photovoltaic system based at least partially on location-specific information and the estimated number of modules.

22. The system of claim 21, wherein the installation information comprises information related to required installation parts, estimated costs, point-load, and electrical requirements for the photovoltaic system.

23. The system of claim 21, wherein the application program is further configured to receive at least one of customer account information, location-specific information, and electrical codes.

24. A non-transitory computer-readable storage medium storing instructions that when executed by a processor cause the processor to perform instructions, the instructions comprising:
receiving site survey information from a site survey performed at location including a structure, the site survey information including customer information, electrical information for the structure, illustrations of a roof of the structure, measurements of the roof, roof obstruction information, tilt information for the roof, photos of the structure, photos of the sky from one or locations on the roof, a utility bill for the structure, and structure utility usage information;
determining an ideal usage offset ratio for a photovoltaic system based on one or more parameters associated with the structure determined via at least some of the site survey information;
estimating a number of modules required to meet the determined ideal usage offset ratio;
generating a roof plan based on at least a portion of the site survey information, the roof plan including an illustration of each roof section of the roof, each roof section illustration depicting one or more modules of the number of modules and at least one of a trunk cable, hatching, and a conduit;
comparing estimated production levels for the photovoltaic system including the number of modules at the location to required production levels;
one of approving and rejecting the photovoltaic system based on the comparison of the estimated production levels and the required production levels; and
generating installation information for the photovoltaic system based at least partially on location-specific information and the estimated number of modules.

25. The non-transitory computer-readable storage medium of claim 24, wherein generating installation information comprises generating installation information comprising required installation materials, estimated costs, point-load, and electrical information for the photovoltaic system.

* * * * *